(12) United States Patent
Arai et al.

(10) Patent No.: US 7,994,617 B2
(45) Date of Patent: Aug. 9, 2011

(54) SEMICONDUCTOR DEVICE

(75) Inventors: Yasuyuki Arai, Atsugi (JP); Yuko Tachimura, Atsugi (JP); Yohei Kanno, Isehara (JP); Mai Akiba, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 975 days.

(21) Appl. No.: 10/587,237

(22) PCT Filed: Feb. 1, 2005

(86) PCT No.: PCT/JP2005/001739
§ 371 (c)(1),
(2), (4) Date: Jul. 26, 2006

(87) PCT Pub. No.: WO2005/076359
PCT Pub. Date: Aug. 18, 2005

(65) Prior Publication Data
US 2007/0159335 A1 Jul. 12, 2007

(30) Foreign Application Priority Data
Feb. 6, 2004 (JP) ................................. 2004-030369

(51) Int. Cl.
*H01L 23/02* (2006.01)
(52) U.S. Cl. ......... 257/679; 257/E23.128; 257/E23.181; 343/700; 343/866; 343/872; 343/873
(58) Field of Classification Search ................... 257/679, 257/86, E23.128, E23.181; 343/700, 866, 343/872, 873
See application file for complete search history.

(56) References Cited

U.S. PATENT DOCUMENTS

| 5,308,967 A | 5/1994 | Jurisch |
| 6,268,695 B1 | 7/2001 | Affinito |

(Continued)

FOREIGN PATENT DOCUMENTS

CN     1392615     1/2003

(Continued)

OTHER PUBLICATIONS

Office Action (Application No. 200580004279.X) Dated Apr. 11, 2008.

(Continued)

*Primary Examiner* — Evan Pert
*Assistant Examiner* — Eduardo A Rodela
(74) *Attorney, Agent, or Firm* — Eric J. Robinson; Robinson Intellectual Property Law Office, P.C.

(57) ABSTRACT

An object of the present invention is providing a semiconductor device that is capable of improving the reliability of a semiconductor element and enhancing the mechanical strength without suppressing the scale of a circuit. The semiconductor device includes an integrated circuit sandwiched between first and second sealing films, an antenna electrically connected to the integrated circuit, the first sealing film sandwiched between a substrate and the integrated circuit, which includes a plurality of first insulating films and at least one second insulating film sandwiched therebetween, the second sealing film including a plurality of third insulating films and at least one fourth insulating film sandwiched therebetween. The second insulating film has lower stress than the first insulting film and the fourth insulating film has lower stress than the third insulating film. The first and third insulating films are inorganic insulating films.

17 Claims, 15 Drawing Sheets

U.S. PATENT DOCUMENTS

| | | | |
|---|---|---|---|
| 6,844,906 B2 * | 1/2005 | Moon et al. | 349/123 |
| 6,849,877 B2 | 2/2005 | Yamazaki et al. | |
| 6,887,650 B2 | 5/2005 | Shimoda et al. | |
| 6,974,909 B2 * | 12/2005 | Tanaka et al. | 174/529 |
| 7,067,976 B2 | 6/2006 | Yamazaki | |
| 7,211,828 B2 | 5/2007 | Yamazaki et al. | |
| 2001/0040645 A1 * | 11/2001 | Yamazaki | 349/42 |
| 2002/0134979 A1 * | 9/2002 | Yamazaki et al. | 257/59 |
| 2003/0027369 A1 | 2/2003 | Yamazaki | |
| 2003/0034497 A1 * | 2/2003 | Yamazaki et al. | 257/86 |
| 2003/0057422 A1 | 3/2003 | Yamazaki et al. | |
| 2005/0088088 A1 | 4/2005 | Yamazaki | |
| 2005/0106839 A1 | 5/2005 | Shimoda et al. | |
| 2005/0127371 A1 | 6/2005 | Yamazaki et al. | |
| 2007/0164295 A1 | 7/2007 | Yamazaki et al. | |

FOREIGN PATENT DOCUMENTS

| | | |
|---|---|---|
| EP | 1455394 A | 9/2004 |
| JP | 2000-020665 | 1/2000 |
| JP | 2003-086352 | 3/2003 |
| JP | 2003-086356 | 3/2003 |
| JP | 2003-086359 | 3/2003 |
| JP | 2003-100450 | 4/2003 |
| WO | WO-2003/010825 | 2/2003 |

OTHER PUBLICATIONS

International Search Report (Application No. PCT/JP2005/001739) dated May 10, 2005.

Written Opinion (Application No. PCT/JP2005/001739) dated May 10, 2005.

* cited by examiner

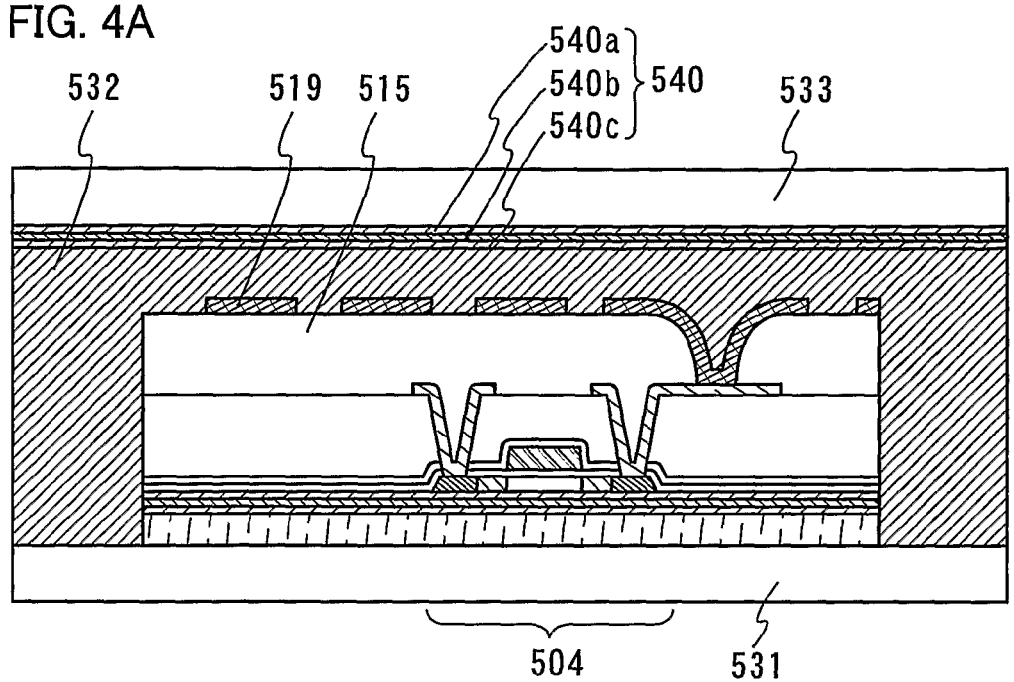
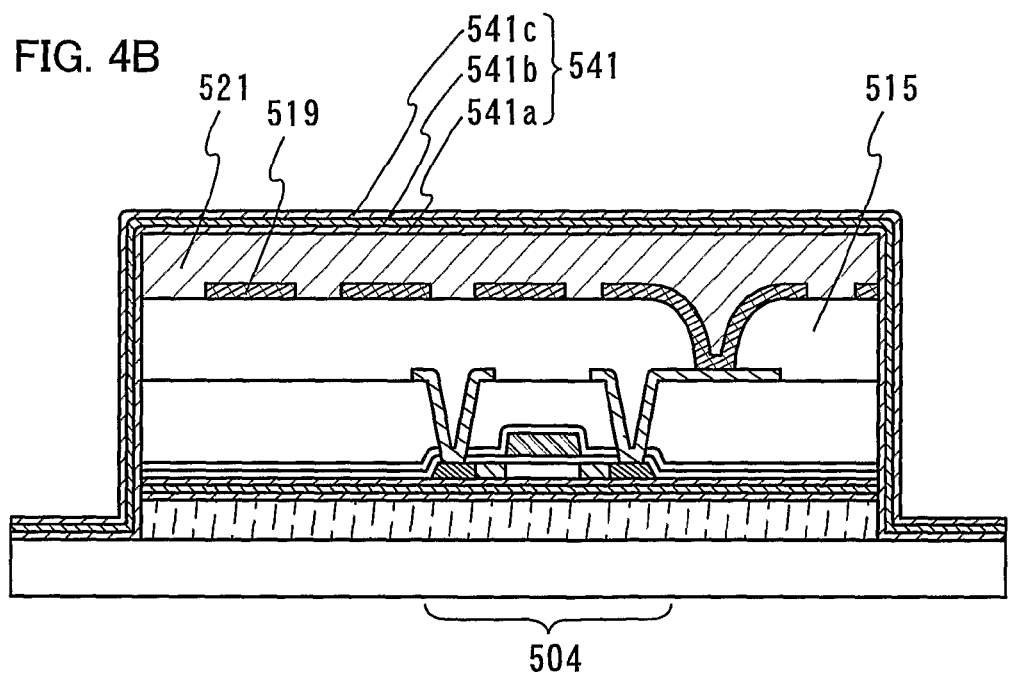

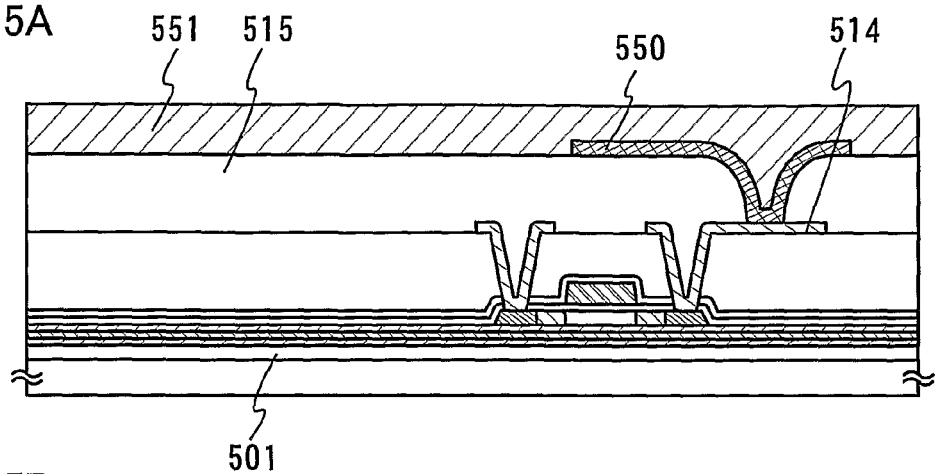
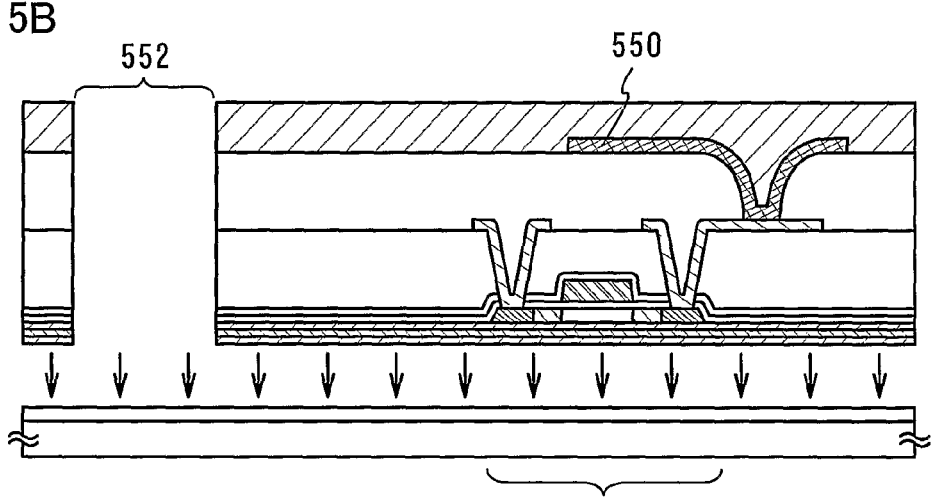
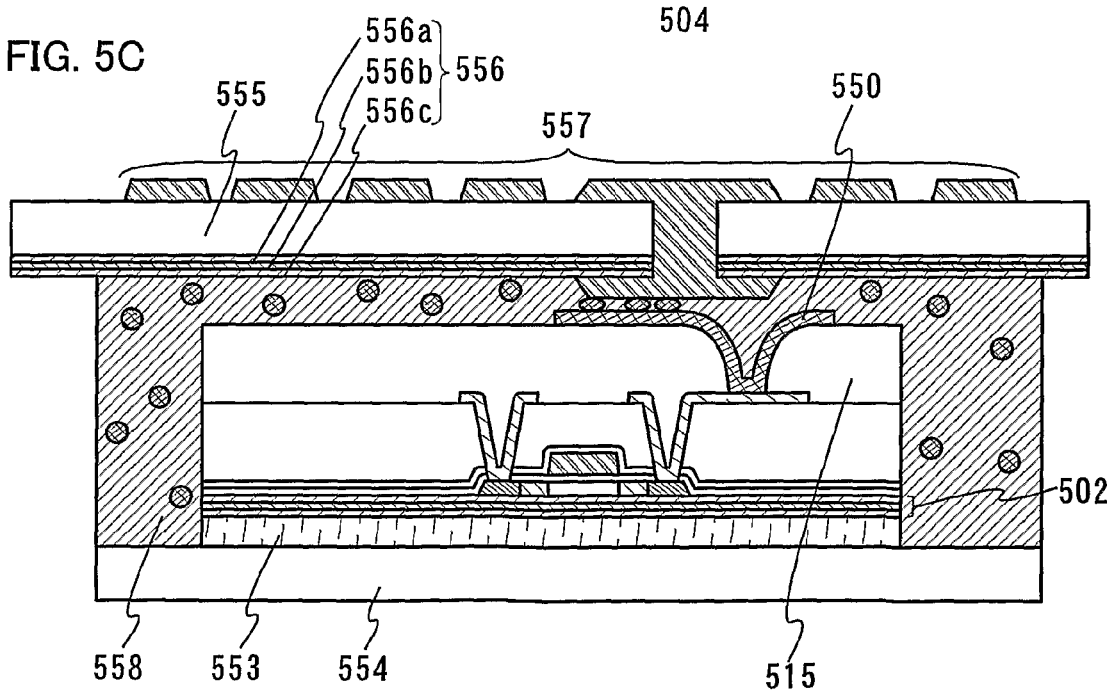

SEMICONDUCTOR DEVICE

TECHNICAL FIELD

The present invention relates to a semiconductor device which is capable of communicating via radio waves.

BACKGROUND ART

A semiconductor device typified by an ID chip, which can send and receive data such as identification information by radio, has been put to practical use in various fields. The semiconductor device has been expected to expand a market as a new type of a communication and information terminal. The ID chip is also referred to as a wireless tag, RFID (radio frequency identification) tag, and an IC tag. In particular, an ID chip comprising an antenna and an integrated circuit formed over a semiconductor substrate has been put to practical use now.

DISCLOSURE OF INVENTION

The reliability of an ID chip depends on the reliability of a semiconductor element that is used for an integrated circuit of the ID chip. Increasing the reliability of the semiconductor element allows to ease environmental conditions to use the ID chip, thereby expanding the range of application concerning the ID chip. However, it is assumed that the semiconductor element is contaminated with alkali metal such as Na, alkali earth metal and moisture, depending on the environment to be used with the ID chip. When the alkali metal, the alkali earth metal or moisture is dispersed in a semiconductor film used in the semiconductor element, the characteristics of the semiconductor element are deteriorated, and therefore, the reliability of the ID chip is hardly improved.

The ID chip can further be miniaturized as compared with a magnetic card, a bar code and the like, and therefore, the application range of the ID chip has been expected to be enlarged. In turn, it is assumed that the ID chip be attached to a material with flexibility (a flexible material) such as a paper and plastics depending on the intended purpose. However, a semiconductor substrate has lower mechanical strength than those of the above magnetic card and bar code. When the ID chip is formed over a packing material, a certificate, a bank note, a portfolio and the like, each of which uses a flexible material as its support medium, there is a probability that the ID chip is damaged in use. Therefore, the ID chip has been not feasible.

The mechanical strength of the ID chip can be improved to some extent by reducing the dimension of the ID chip itself. In this case, however, a circuit with the adequate scale is hardly ensured, which results in limitation in the application of the ID chip. This is not preferable. Meanwhile, when it is emphasized that the enough scale of the circuit is ensured, the dimension of the ID chip cannot be reduced randomly so that the improvement of the mechanical strength is limited.

In the case of using an ID chip formed using the semiconductor substrate, the semiconductor substrate serves as a conductor to block radio waves. Accordingly, there is a drawback in which signals are easily attenuated depending on the direction of transmitting the radio waves.

In view of the above problems in the conventional art, the present invention has an object to provide a semiconductor device which is capable of increasing the reliability of a semiconductor element and improving the mechanical strength without suppressing the scale of a circuit.

The semiconductor device of the present invention uses a TFT (thin film transistor), which is formed using an electrically-isolated semiconductor thin film, as its integrated circuit. The integrated circuit is sandwiched with films formed by laminating plural insulating films (hereinafter referred to as sealing films).

Each sealing film includes plurality insulating films made from an inorganic material (hereinafter, a barrier film) that can prevent the alkali metal such as Na, alkali earth metal, moisture and the like from penetrating into a semiconductor film included in a semiconductor element and an insulating film with lower stress than the barrier film (hereinafter, a stress relaxation film). Each sealing film may include one or plural stress relaxation films, wherein one or plural stress relaxation films are formed between the barrier films.

As the barrier films which can prevent the alkali metal, alkali earth metal, moisture and the like from penetrating into the semiconductor film, inorganic insulating films typified by silicon nitride, silicon nitride oxide and the like can be used.

The integrated circuit may be formed over a substrate. Or, after forming the integrated circuit over a substrate, it may be separated from the substrate to be attached to a flexible substrate (or, with flexibility), which is separately prepared. The ID chip of the invention can be in the form of an ID chip comprising an antenna along with the integrated circuit. The integrated circuit is operated by using an alternating voltage generated in the antenna. By modulating the alternating voltage applied to the antenna, the integrated circuit can send a signal to a reader/writer. The antenna may be formed along with the integrated circuit, or may be formed individually such that it is electrically connected to the integrated circuit later.

The attachment of the integrated circuit may, for example, be carried out according to various kinds of methods as follows. A metal oxide film is formed between a high heat resistant substrate and an integrated circuit, and the metal oxide film is weakened to separate the integrated circuit from the substrate so that the integrated circuit is attached to an abject. Or, a separation layer is provided between a high heat resistant substrate and an integrated circuit, the separation film is removed by irradiation of laser beam or by etching to separate the integrated circuit from the substrate so that the integrated circuit is attached to an object. Or, a high heat resistant substrate over which an integrated circuit is formed is mechanically removed or is removed by etching using a solution or a gas to separate the integrated circuit from the substrate, thereby attaching the integrated circuit to an object.

Also, by attaching integrated circuits, which are formed separately, to one another, the integrated circuits may be laminated such that the scale of the circuits or the memory capacity is increased. Since the respective integrated circuits are dramatically thin in thickness as compared with an ID chip manufactured using a semiconductor substrate, the mechanical strength of an ID chip can be maintained to some extent even when the plural integrated circuits are stacked together. The stacked integrated circuits can be connected to one another by using a known connection method such as flip chip technology, a TAB (tape automated bonding) technology and a wire bonding technology.

The use of the barrier films can prevent the alkali metal, alkali earth metal, moisture and the like from dispersing in the semiconductor film, thereby improving the reliability of the semiconductor element. The inorganic insulating films used for the barrier films have relatively large stress, and hence, there is a possibility that the use of the inorganic insulating films adversely affects the characteristics of the semiconductor element, e.g., the mobility is varied. According to the invention, however, since the sealing films including a stress relaxation film that is formed between the barrier films are employed, the stress of the barrier films is alleviated, thereby preventing the characteristics of the semiconductor element from being adversely affected.

To inhibit ingress of the alkali metal, alkali earth metal, moisture and the like into the semiconductor film, plural barrier films are provided in the invention rather than simply increasing the thickness of a barrier film. Therefore, the stress per a sheet of the barrier films can be suppressed, which prevents the respective barrier films from cracking along with the ingress of the alkali metal, alkali earth metal, moisture and the like into the semiconductor film.

In the case of using a flexible substrate such as a plastic substrate and a paper as a substrate to be formed with an ID chip, it is assumed that the substrate becomes stressed. According to the invention, however, since the plural barrier films are provided, the stress per a sheet of the barrier films is suppressed. In addition, the stress can be alleviated to some extent by the stress relaxation film. Consequently, it is possible to prevent the adverse effects on the semiconductor element due to the stress or the ingress of the alkali metal, alkali earth metal, moisture and the like into the semiconductor film.

Generally, the flexible substrate such as the plastic substrate and the paper tends to be permeated with moisture easily as compared with a glass substrate, a semiconductor substrate and the like. Since the barrier films are used in the present invention, ingress of moisture into the semiconductor film can be prevented even in the case of using the foregoing flexible substrate.

The flexible substrate such as the plastic substrate and the paper is generally inferior in the heat resistance property as compared with the glass substrate, the semiconductor substrate and the like. According to the invention, since a film deposition temperature is set to be low in consideration of the heat resistance property of the flexible substrate, the quality of a barrier film may be deteriorated. However, the plural barrier films are laminated according to the invention, thereby preventing the alkali metal, alkali earth metal and moisture from penetrating into the semiconductor film.

The ID chip of the invention is formed with an integrated circuit that is formed by using an electrically-isolated TFT so that a flexible substrate can be employed. In this case, high mechanical strength can be obtained without increasing the dimension of the ID chip as much as an ID chip using a semiconductor substrate. Accordingly, the mechanical strength of the ID chip can be improved, thereby enlarging the application range of the ID chip without suppressing the scale of the circuit.

Furthermore, the ID chip according to the invention comprises advantages as follows. Since the integrated circuit is formed using the electrically-isolated TFT in the ID chip of the invention, a parasitic diode is hardly formed between the integrated circuit and the substrate, unlike a transistor formed over a semiconductor substrate. Therefore, a large amount of current does not flow through a drain region due to a potential of an alternating-current signal that is applied to a source or a drain region, which hardly causes the deterioration or failure. As compared with an ID chip using a semiconductor substrate, radio waves are hardly blocked in the ID chip of the invention so that a signal can be prevented from being attenuated due to blocking of the radio waves.

BRIEF DESCRIPTION OF DRAWINGS

FIGS. 4A and 4B are cross sectional views showing a method of manufacturing an ID chip according to the invention;

FIGS. 5A to 5C are cross sectional views showing a method of manufacturing an ID chip according to the invention;

BEST MODE FOR CARRYING OUT THE INVENTION

The embodiment mode according to the present invention will hereinafter be described with reference to the accompanying drawings. The present invention can be carried out in many different modes, and it is easily understood by those who skilled in the art that embodiments and details herein disclosed can be modified in various ways without departing from the purpose and the scope of the invention. It should be noted that the description of the embodiment modes to be given below should not be interpreted as being limited to the invention.

Figure 1A:
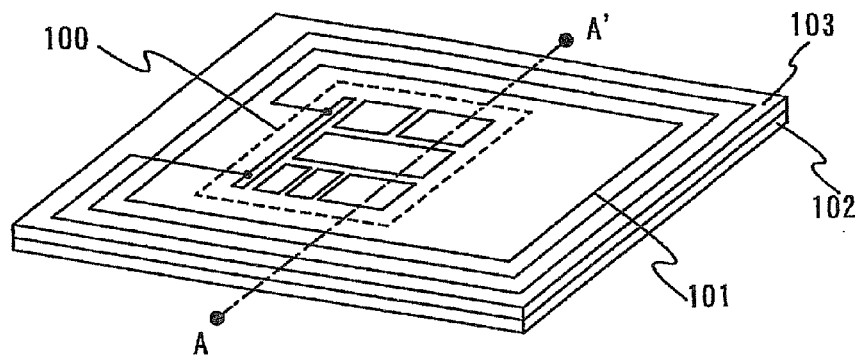
FIG. 1A is an external view and FIGS. 1B and 1C are cross sectional views of an ID chip according to the present invention.
Figure 1B:
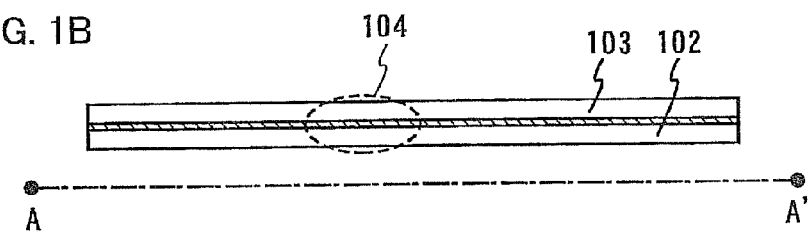

A structure of an ID chip according to the invention will be described with reference to FIGS. 1A to 1C. FIG. 1A is a perspective view of one mode for the ID chip and FIG. 1B is a cross sectional view taken along a line A-A' of FIG. 1A, wherein reference numeral 100 indicates an integrated circuit and reference numeral 101 indicates an antenna. The antenna 101 is electrically connected to the integrated circuit 100. Reference numeral 102 denotes a substrate and reference numeral 103 denotes a cover member. The integrated circuit 100 is sandwiched between the substrate 102 and the cover member 103.

A state in which the antenna 101 along with the integrated circuit 100 are sandwiched between the substrate 102 and the cover member 103 is shown in FIG. 1A. The present invention is not particularity limited to the structure. For instance, the antenna 101 may be formed on another face of the cover member 103 that is opposite side of the face in contact with the substrate 102 and an opening may be formed in the cover member 103 such that the integrated circuit 100 and the antenna 101 are electrically connected to each other through the opening.

Figure 1C:
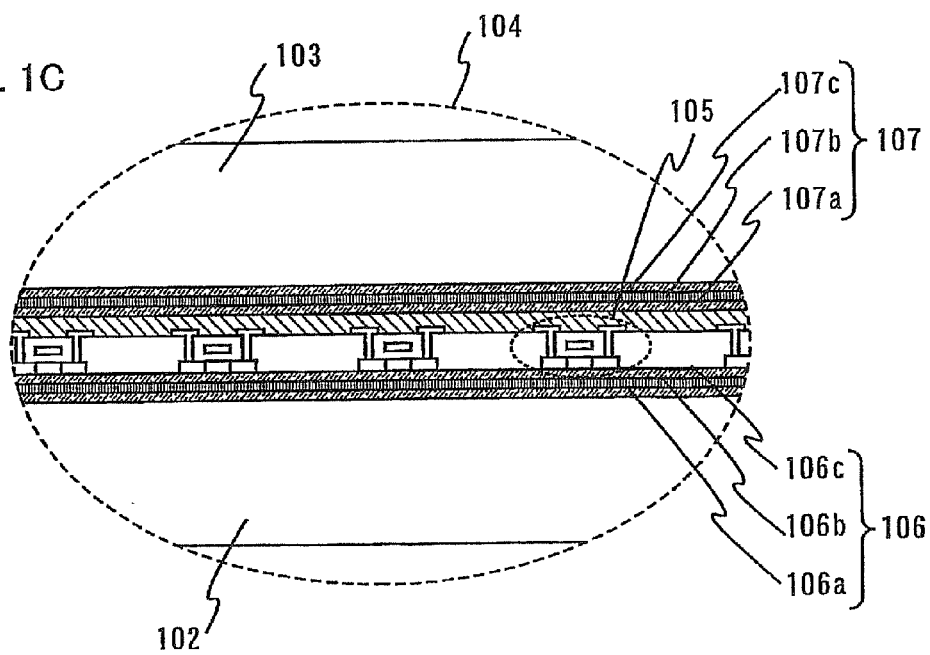

An enlarged view of a cross section for the ID chip, which corresponds to a portion surrounded by a dashed line 104 in FIG. 1B, is shown in FIG. 1C. A TFT 105 coincides with one of semiconductor elements that are used in the integrated circuit 100. Although FIG. 1C shows the TFT as one of the semiconductor elements used in the integrated circuit 100, the present invention is not limited to the structure. Various kinds of circuit elements can be used as the semiconductor elements for the integrated circuit. In addition to the TFT, for example, a memory element, a diode, a photoelectric conversion element, a resistive element, a coil, a capacitor element, an inductor and the like can typically be employed.

The TFT 105 is sandwiched between sealing films 106 and 107. Concretely, the sealing film 106 is provided between the substrate 102 and the TFT 105, while the sealing film 107 is provided between the cover member 103 and the TFT 105. The sealing film 106 includes a barrier film 106a, a stress relaxation film 106b and a barrier film 106c, which are sequentially laminated on the substrate 102. The sealing film 107 includes a barrier film 107a, a stress relaxation film 107b and a barrier film 107c, which are sequentially laminated over the TFT 105.

FIG. 1C shows an example in which the sealing films 106 and 107 comprise the stress relaxation films 106b and 107b, respectively, however, the present invention is not limited to the configuration. When each sealing film includes three or more barrier films, plural stress relaxation films may be provided between the barrier films.

The barrier films 106a, 106c, 107a and 107c are made from plural inorganic insulating films so as to prevent alkali metal such as Na, alkali earth metal, moisture and the like from penetrating into a semiconductor film used in the semiconductor element. For example, silicon nitride, silicon nitride oxide, aluminum oxide, aluminum nitride, aluminum nitride oxide, aluminum silicon nitride oxide and the like can be employed as the barrier films 106a, 106c, 107a and 107c.

The stress relaxation films 106b and 107b can be made from insulating films with lower stress as compared with the barrier films 106a, 106c, 107a and 107c. For instance, polyimide, acrylic, polyamide, polyimide amide, benzocyclobutene, epoxy resin and the like can be used as the stress relaxation films 106b and 107b.

Although the example in which the mechanical strength of the ID chip is improved by using the cover member 103 is shown in FIGS. 1A to 1C, the ID chip of the invention does not necessarily use the cover member 103. For example, the mechanical strength of the ID chip according to the invention can be improved by coating the surface of the sealing film 107 with a resin etc.

The integrated circuit 100 may be formed on the substrate 102 directly if the substrate 102 has a heat resistance property, which can withstand heat treatment in the step of manufacturing the integrated circuit 100. When using a substrate, which is inferior in the heat resistance, like a plastic substrate, after forming the integrated circuit over a heat resistant substrate, the integrated circuit may be separated from the heat resistant substrate and then attached to a flexible substrate like plastics, which is separately prepared. In this case, the integrated circuit along with the sealing films may be formed over the heat resistant substrate previously so that both the integrated circuit and the sealing films may be attached to the flexible substrate after they are separated from the heat resistant substrate. Or, a sealing film may be formed over the flexible substrate in advance so that the integrated circuit is attached to the sealing film.

When attaching the integrated circuit along with the sealing films to the flexible substrate, the alkali metal, alkali earth metal, moisture and the like can be prevented from intruding into the semiconductor film included in the semiconductor element in a series of steps from separating to attaching due to the sealing films. In the series of steps, even when some of the plural barrier films that are included in the sealing films are cracked by applying stress to the sealing films or the integrated circuit in some sort of trigger, the other barrier films can prevent the ingress of the alkali metal, alkali earth metal, moisture and the like. Also, in the series of the steps, when the sealing films or the integrated circuit become stressed, deterioration in the characteristics of the semiconductor elements can be prevented by alleviating the stress.

Next, a method of manufacturing the ID chip according to the invention will be described in more detail below. Note that although the embodiment mode shows the electrically-isolated TFT as one of the semiconductor elements, the present invention is not limited thereto, and various types of circuit elements can be used as the semiconductor elements that are included in the integrated circuit.

Figure 2A:
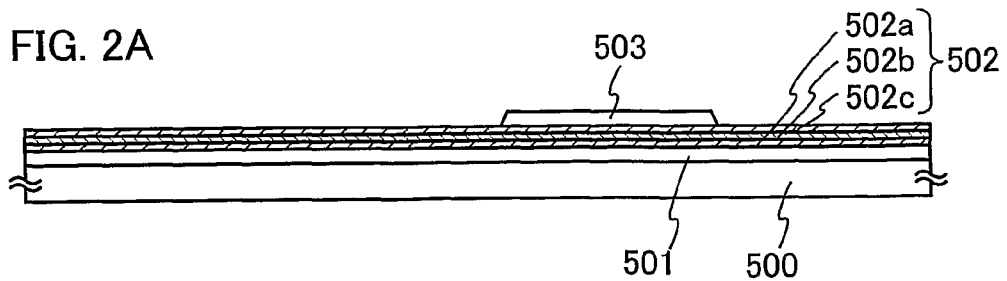
FIGS. 2A to 2D are cross sectional views showing a method of manufacturing an ID chip according to the invention.

As shown in FIG. 2A, a separation layer 501 is formed over a heat resistant substrate (i.e., a first substrate) 500 by sputtering. As the first substrate 500, a substrate that can withstand a processing temperature in the subsequent manufacturing steps, for example, a glass substrate such as a barium borosilicate glass and a alumino borosilicate glass is employed.

As the separation layer 501, a layer containing silicon as its principal constituent such as amorphous silicon, polycrystalline silicon, single crystalline silicon and microcrystalline silicon (including semiamorphous silicon) can be employed. The separation layer 501 can be formed by sputtering, plasma CVD and the like. In the embodiment mode, amorphous silicon with a thickness of about 500 nm is formed by sputtering as the separation layer 501. The material for the separation layer 501 is not particularly limited to silicon, and the separation layer can be made from a material, which can be removed easily and selectively by etching.

A sealing film 502 is formed over the separation layer 501. The sealing film 502 may include at least two or more barrier films and one or more stress relaxation films sandwiched between the barrier films.

In the embodiment mode, for instance, a barrier film 502a, a stress relaxation film 502b and a barrier film 502c are sequentially laminated on the separation layer 501. The barrier films 502a and 502c are, for example, formed of silicon nitride by sputtering. The stress relaxation film 502b is, for example, formed of polyimide.

Silicon nitride used for forming the barrier films 502a and 502c are formed by introducing argon while maintaining a substrate temperature of 150° C. at sputtering pressure of about 0.4 Pa. Then, the silicon nitride is achieved by using silicon as a target and introducing nitrogen and hydrogen in addition to the argon. In the case of using silicon nitride oxide as the barrier films 502a and 502c, silicon nitride oxide is formed by introducing argon while maintaining a substrate temperature of 150° C. at sputtering pressure of about 0.4 Pa. Then, the silicon nitride oxide is completed by using silicon as a target and introducing nitrogen, nitrogen dioxide and hydrogen in addition to the argon. Note that silicon oxide may be used as the target in place of silicon.

The thicknesses of the barrier films 502a and 502c are desirably in the range of 50 nm to 3 μm. Silicon nitride films are, herein, formed with a thickness of 1 μm. The method for forming the barrier films is not limited to the sputtering, and an operator can select the method arbitrarily. For example, LPCVD, plasma CVD and the like can be employed.

The barrier films 502a and 502c can be made from silicon nitride oxide, aluminum oxide, aluminum nitride, aluminum nitride oxide or aluminum silicon nitride oxide (AlSiON), as substitute for silicon nitride. Since aluminum silicon nitride oxide has a relatively high thermal conductivity, when the barrier films are made from aluminum silicon nitride oxide, heat generated in the semiconductor elements can be released efficiently.

The stress relaxation film 502b is made from a transparent resin. Typically, polyimide, acrylic, polyamide, polyimide amide, benzocyclobutene, epoxy resin and the like can be employed. Resins except of the foregoing resin can be used. Here, heat-polymerizing polyimide is applied and baked to form the stress relaxation film 502b.

The thickness of the stress relaxation film 502b is preferably in the range of 200 nm to 2 µm. In the embodiment mode, polyimide with a thickness of 1 µm is formed.

The barrier films 502a, 502c and the stress relaxation film 502b are necessary to be made from materials capable of achieving selectivity upon removing the separation layer 501 later.

The sealing film 502 is formed to prevent alkali metal such as Na, alkali earth metal and moisture, which are contained in a second substrate and an adhesive agent, from penetrating into the semiconductor elements upon attaching the semiconductor elements to the second substrate with the adhesive agent so as not to adversely affect the characteristics of the semiconductor elements. Further, the sealing film 502 serves to protect the semiconductor elements from etchant upon etching the separation layer 501.

A semiconductor film is next formed on the sealing film 502. Preferably, the semiconductor film is formed without being exposed to atmospheric air after forming the sealing film 502. The thickness of the semiconductor film is set to be 20 to 200 nm (desirably, 40 to 170 nm, more preferably, 50 to 150 nm). The semiconductor film may be an amorphous semiconductor, a semiamorphous semiconductor or a polycrystalline semiconductor. The semiconductor film may contain either silicon or silicon germanium. When using silicon germanium, the concentration of germanium is preferably set to be about 0.01 to 4.5 atomic %.

The semiconductor film may be crystallized by a known method. As the known crystallization method, there are laser crystallization using laser beam, crystallization using a catalytic element and the like. Or, a method in combination of the crystallization using a catalytic element and the laser crystallization can be used. When an excellent heat resistant substrate like quartz is used as the substrate 500, thermal crystallization using an electrically-heated furnace, lamp annealing crystallization using infrared light, crystallization using a catalytic element, crystallization in combination with high temperature annealing of about 950° C. or the like can be used.

In the case of laser crystallization, for example, the semiconductor film is subjected to thermal annealing at a temperature of 500° C. for one hour to enhance a resistance property with respect to laser beam prior to performing laser crystallization. A continuous wave solid-state laser is used and laser beam with second to fourth harmonics is irradiated to the semiconductor film to obtain a crystal with a large grain size. Typically, for instance, the second harmonic (532 nm) or the third harmonic (355 nm) of $Nd:YVO_4$ laser (fundamental wave with 1064 nm) is preferably used. Concretely, laser beam emitted from the continuous wave $YVO_4$ laser is converted into a harmonic by a nonlinear optical element to obtain laser beam with 10 W output. The laser beam is preferably formed to have a rectangular shape or an elliptical shape on a surface of the semiconductor film to be irradiated with the laser beam. In this case, the power density of about 0.01 to 100 $MW/cm^2$ (preferably, 0.1 to 10 $MW/cm^2$) is required. The scanning rate is approximately set to be about 10 to 2,000 cm/sec to irradiate the semiconductor film.

While the oscillation frequency of pulsed laser beam is set to be 10 MHz or more, laser crystallization may be carried out using an extremely higher frequency band than a frequency band of several tens Hz to several hundreds Hz, which is generally used. The period form irradiating pulsed laser beam to the semiconductor film to curing the semiconductor film completely is considered to be several tens nsec to several hundreds nsec. By utilizing the above-mentioned frequency band, next pulsed laser beam can be irradiated to the semiconductor film until the semiconductor film is melted due to irradiation of laser beam and solidified. Therefore, a solid-liquid interface can be moved continuously on the semiconductor film so that the semiconductor film having crystal grains, which are continuously grown in the scanning direction, can be formed. Specifically, an aggregate of crystal grains each of which has a width in a scanning direction of 10 to 30 µm and a width in a direction perpendicular to the scanning direction of 1 to 5 µm can be obtained. By forming the single crystal grains growing toward the scanning direction, the semiconductor film in which almost no crystal grain boundary is formed in a channel direction of a TFT can be formed.

With respect to the laser crystallization, continuous wave laser beam of a fundamental wave may be irradiated in parallel with continuous wave laser beam of a higher harmonic. Or, continuous wave laser beam of a fundamental wave may be irradiated in parallel with pulsed laser beam of a higher harmonic.

Laser beam may be irradiated under an inert gas atmosphere such as rare gas and nitrogen gas. This suppresses the surface roughness of the semiconductor due to irradiation of laser beam so that variation in the threshold value caused by fluctuation in the interface state density can further be suppressed.

By irradiating laser beam to the semiconductor film above, the semiconductor film with improved crystallinity can be formed. Note that a polycrystalline semiconductor may previously be formed by sputtering, plasma CVD, thermal CVD or the like.

Although the semiconductor film is crystallized in the embodiment mode, an amorphous semiconductor or a microcrystalline semiconductor may be kept intact and subjected to subsequent processing without being crystallized. As compared with the TFT using a polycrystalline semiconductor, a TFT using the amorphous or microcrystalline semiconductor requires less number of manufacturing steps, and hence, has an advantage of suppressing cost and improving yield.

The amorphous semiconductor can be obtained by performing glow discharge decomposition with silicide gas. Typically, $SiH_4$ and $Si_2H_6$ are cited as the silicide gas. These silicide gases can be diluted with hydrogen or hydrogen and helium.

The semiamorphous semiconductor is a film containing a semiconductor with an intermediate structure between an amorphous semiconductor and a crystalline semiconductor (including a single crystal structure and a polycrystalline structure). The semiamorphous semiconductor has a third condition that is stable in term of free energy, and includes a crystalline region having a short range order along with lattice distortions. A crystal region with a size of 0.5 to 20 nm can be dispersed in the semiamorphous semiconductor. Raman spectrum is shifted toward lower wavenumbers than 520 cm$^{-1}$. The diffraction peaks of (111) and (220), which are believed to be derived from silicon crystal lattice, are observed in the semiamorphous semiconductor by X-ray diffraction. The semiamorphous semiconductor contains hydrogen or halogen of at least 1 atomic % or more as a neutralizing agent for dangling bonds. The semiamorphous having the above mentioned structures is, herein, referred to as the semiamorphous semiconductor (SAS) for the sake of convenience. The lattice distortions are further extended by adding an rare gas element such as helium, argon, krypton and neon so that the favorable semiamorphous semiconductor with improved reliability can be obtained.

The SAS is formed by glow discharge decomposition with silicide gas. SiH$_4$ is a representative silicide gas. In addition to SiH$_4$, Si$_2$H$_6$, SiH$_2$Cl$_2$, SiHCl$_3$, SiCl$_4$, SiF$_4$ and the like can be used as the silicide gas. The silicide gas may also be diluted with hydrogen, or a mixture of hydrogen and one or more of rare gas elements selected from helium, argon, krypton, and neon such that the SAS is easily formed. The dilution ratio is set to be in the range of 1:2 to 1:1,000. In addition, a carbide gas such as CH$_4$ and C$_2$H$_6$ or germanium gas such as GeH$_4$ and GeF$_4$ or F$_2$ may be mixed in the silicide gas so that the width of the energy band may be adjusted in the range of 1.5 to 2.4 eV or 0.9 to 1.1 eV.

In the case of forming a semiamorphous semiconductor with a gas containing a mixture of SiH$_4$ and H$_2$ or a gas containing a mixture of SiH$_4$ and F$_2$, for example, when a TFT is manufactured using the semiamorphous semiconductor, the subthreshold coefficient (S value) of the TFT can be set to be 0.35 V/sec or less, typically, 0.25 to 0.09V/sec, while the mobility thereof can be set to be 10 cm$^2$/Vsec. When a ring oscillator is formed by using the TFT using the above amorphous semiconductor, for example, the ring oscillator can be operated at the drive voltage of about 3 to 5 V and at 10 MHz or more. The frequency characteristics for each stage can be set to be 100 kHz or more, preferably, 1 MHz or more, at the drive voltage of about 3 to 5 V.

Figure 2B:
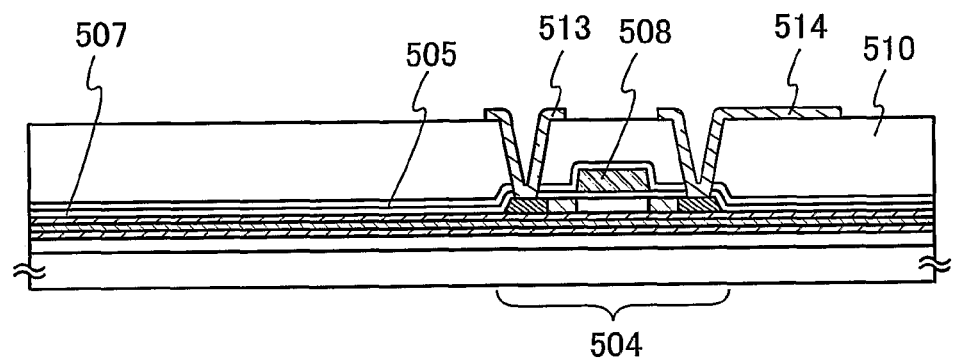

As shown in FIG. 2A, the semiconductor film is patterned to form an island-like semiconductor film 503. As shown in FIG. 2B, various kinds of semiconductor elements typified by a TFT is formed utilizing the island-like semiconductor film 503. Although the sealing film 502 and the island-like semiconductor film 503 are in contact with each other in FIG. 2B, an electrode, an insulating film and the like may be formed between the sealing film 502 and the island-like semiconductor film 503 depending on the kinds of the semiconductor elements to be formed. When forming a bottom-gate TFT that is a kind of the semiconductor element, for example, a gate electrode and a gate insulating film are formed between the sealing film 502 and the island-like semiconductor film 503.

In FIG. 2B, a top-gate TFT 504 is formed using the island-like semiconductor film 503. Concretely, a gate insulating film 507 is formed so as to cover the island-like semiconductor film 503, and a conductive film is formed on the gate insulating film 507 and patterned to form a gate electrode 508. While utilizing the gate electrode 508 or a pattern formed of a resist as a mask, an impurity imparting an n-type conductivity is doped into the island-like semiconductor film 503 so as to form a source region, a drain region, an LDD region and the like. The TFT 504 is, herein, formed to be of an n-type conductivity. Alternatively, when forming a p-type TFT, an impurity imparting a p-type conductivity is doped into the island-like semiconductor film. According to the above steps, the TFT 504 can be obtained.

After forming the gate insulating film 507, heat treatment may be carried out at 300 to 450° C. for 1 to 12 hours under an atmosphere containing 3 to 100% hydrogen so as to hydrogenate the island-like semiconductor film 503. As other hydrogenation method, plasma hydrogenation (using hydrogen excited by plasma) can be performed. Through the hydrogenation step, dangling bonds can be terminated by the thermally excited hydrogen. If defects are caused in the semiconductor film by bending a second flexible substrate after attaching the semiconductor elements to the second flexible substrate in the subsequent step, the concentration of hydrogen contained in the semiconductor film is set to be $1\times10^{19}$ to $1\times10^{22}$ atoms/cm$^3$, preferably, $1\times10^{19}$ to $5\times10^{20}$ atoms/cm$^3$ by hydrogenation such that the defects can be terminated by the hydrogen contained in the semiconductor film. Or, halogen may be contained in the semiconductor film to terminate the defects.

Note that the method for manufacturing the TFT is not limited to the above configuration.

A passivation film 505 is next formed to cover the TFT 504. Desirably, the passivation film 505 is made from a silicon nitride film or a silicon nitride oxide film so as to prevent the alkali metal or alkali earth metal from penetrating into the TFT 504. Since the TFT 504 is covered with the sealing film 502 and the passivation film 505, the alkali metal such as Na and alkali earth metal, which adversely affect the characteristics of the semiconductor elements, can be prevented from intruding into the semiconductor film that is used in the semiconductor element.

A first interlayer insulating film 510 is formed to cover the passivation film 505. A contact hole is formed in the gate insulating film 507, the passivation film 505 and the first interlayer insulating film 510, and wirings 513 and 514 are formed on the first interlayer insulating film 510 such that they are connected to the TFT 504 via the contact hole.

Figure 2C:
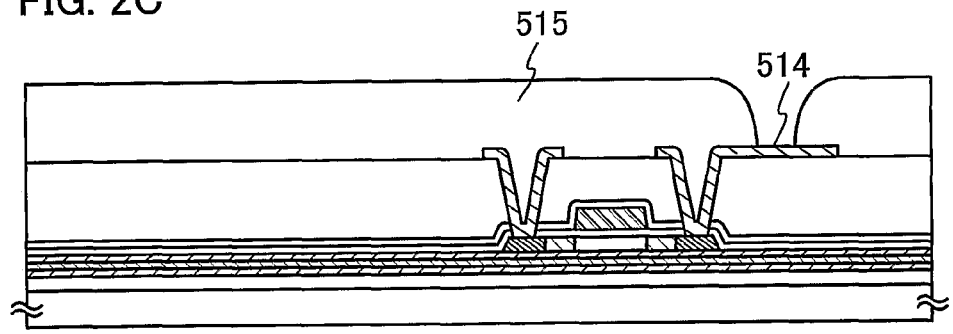

As shown in FIG. 2C, a second interlayer insulating film 515 is next formed on the first interlayer insulating film 510. The second interlayer insulating film 515 is formed to have an opening such that the wiring 514 is partly exposed. As the first and second interlayer insulating films 510 and 515, an organic insulating film, an inorganic insulating film, an insulating film containing a Si—O—Si bond that is formed using siloxane material as a start material (hereinafter, referred to as a siloxane insulating film) and the like can be employed. The siloxane insulating film includes at least one kind of fluorine, alkyl group and aromatic hydrocarbon as its substituent, in addition to hydrogen.

Figure 2D:
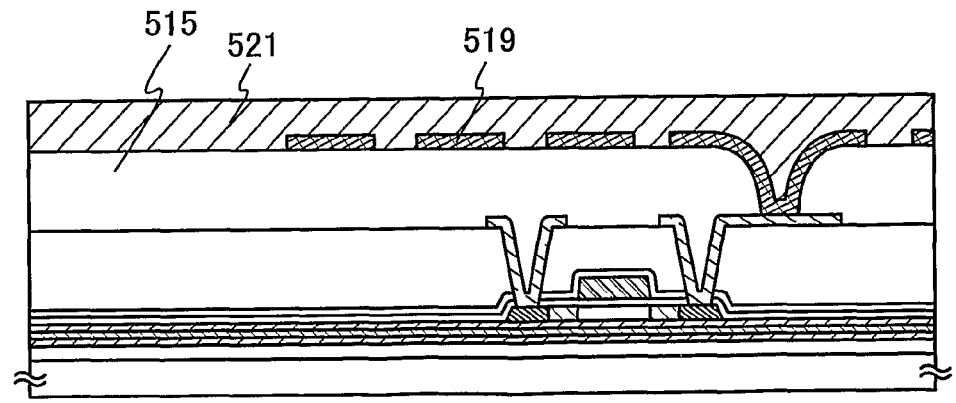

As shown in FIG. 2D, an antenna 519 is formed on the second interlayer insulating film 515. The antenna 519 can be formed of a conductive material containing one or more of metals such as Ag, Au, Cu, Pd, Cr, Mo, Ti, Ta, W and Al or metal compounds. The antenna 519 is connected to the wiring 514. Although the antenna 519 is directly connected to the wiring 514 in FIG. 2D, the ID chip of the present invention is not limited to the structure. For example, the antenna 519 and the wiring 514 may be electrically connected to each other by using a wiring that is separately formed.

The antenna 519 is formed by the printing method, the photolithography, the vapor deposition, the droplet discharging method, and the like. Although the antenna 519 is formed using a single-layer conductive film in the embodiment mode, it may be formed by laminating plural conductive films.

The droplet discharging method indicates a method for forming a predetermined pattern by discharging a droplet containing a prescribed composition through a fine hole, and includes the ink jet method and the like in the category. The printing method includes the screen printing method, the offset printing method and the like. By using the printing method or the droplet discharging method, the antenna 519 can be formed without using a mask for exposure. Differing from the photolithography in which loss of materials is caused by etching, the droplet discharging method and the printing method can utilize materials efficiently. In addition, cost that goes into the making of the ID chip can be suppressed since an expensive mask for exposure is not required.

When using the droplet discharging method or the various kinds of printing methods, for example, a conductive particle in which Cu is coated with Ag can also be used. In the case where the antenna 519 is formed by the droplet discharging method, the surface of the second interlayer insulating film 515 is desirably treated to increase the adhesion of the surface with respect to the antenna 519, in advance.

In order to increase the adhesion of the surface of the second interlayer insulating film, for example, the following three methods can be mentioned. A metal or a metal compound that can improve the adhesion of a conductive film or an insulating film due to catalytic action is attached to the surface of the second interlayer insulating film 515. An organic insulating film, a metal, and a metal compound each of which is well-adhered to a conductive film or an insulating film are attached to the surface of the second interlayer insulating film 515. The surface of the second interlayer insulating film 515 is subjected to plasma processing under atmospheric pressure or reduced pressure to change the properties of the surface thereof. As the metal, which is well-adhered to the conductive film or the insulating film, titanium, titanium oxide, 3d transition elements such as Sc, Ti, V, Cr, Mn, Fe, Co, Ni, Cu, Zn and the like can be cited. As the metal compound, oxide, nitride, and oxynitride of the above-mentioned metals can be cited.

When the metal or the metal compound to be attached to the second interlayer insulating film 515 has conductivity, the sheet resistance is controlled so as not to hinder the normal operation of the antenna. Concretely, the average thickness of the metal or the metal compound with the conductivity may be controlled to be, for example, 1 to 10 nm. Or, the metal or the metal compound may be partly or entirely oxidized to be insulated. Or, in a region other than a region in which the adhesion is intended to be improved, the metal or the metal compound may be selectively removed by etching. Or, the metal or the metal compound may be selectively attached to a certain region of the second interlayer insulating film by the droplet discharging method, the printing method, the sol-gel method, etc. rather than attaching it on the entire surface of the second interlayer insulating film. The metal or the metal compound is not necessary to have a completely continuous shape like a film on the surface of the second interlayer insulating film 515. Alternatively, a plurality of disconnected patterns of the metal or metal compound may be formed. As the organic insulating film, for example, polyimide, siloxane insulating film can be cited.

After forming the antenna 519, a protective layer 521 is formed over the second interlayer insulating film 515 so as to cover the antenna 519. The protective layer 521 is made from a material that can protect the antenna 519 upon removing the separation layer 501 by etching in the subsequent step. For example, a water or alcohol-soluble epoxy resin, acrylate resin or silicon resin is applied to the entire surface of the second interlayer insulating film to form the protective layer 521.

For forming the protective layer 521 in the embodiment mode, a water-soluble resin (#VL-WSHL10 manufactured by Toagosei Co., Ltd.) is applied over the second interlayer insulating film by spin coating to have a thickness of 30 μm and exposed for 2 minutes so as to be cured temporarily. The water-soluble resin is further exposed to UV light from a rear face of the substrate for 2.5 minutes and from a top face thereof for 10 minutes, i.e., for 12.5 minutes in total to be cured completely, thereby obtaining the protective layer 521. When plural kinds of organic resins are laminated to one another, they might be partly dissolved in application or baking or adhesion thereof might be excessively increased depending on the sorts of solvents contained in the organic resins. Therefore, when the second interlayer insulating film 515 and the protective layer 521 are both made from organic resins that are soluble in a same solvent, an inorganic insulating film (e.g., an $SiN_X$ film, an $SiN_XO_Y$ film, an $AlN_X$ film or $AlN_XO_Y$ film) is preferably formed to cover the second interlayer insulating film 515 such that the protective layer 521 is smoothly removed in the subsequent step.

Figure 3A:
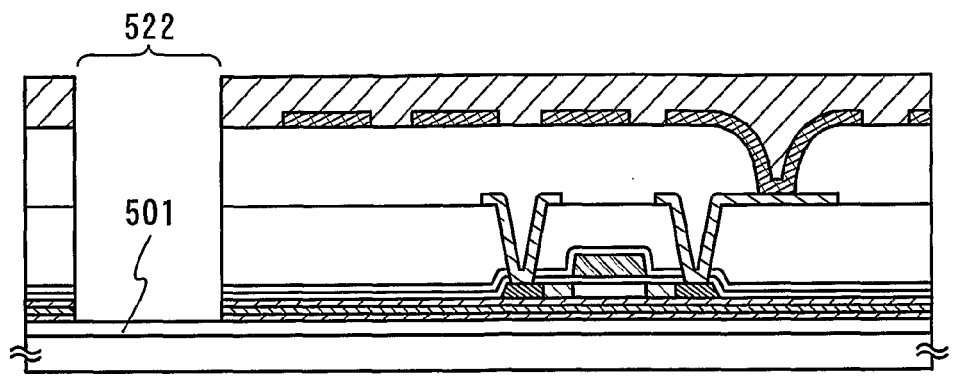
FIGS. 3A to 3C are cross sectional views showing a method of manufacturing an ID chip according to the invention.

As shown in FIG. 3A, a groove 522 is formed to separate the ID chips from one another. The groove 522 may be provided to expose the underlying separation layer 501. The groove 522 can be formed by dicing, scribing, or the like. When the ID chips formed over the first substrate 500 is not necessarily to be divided, the groove 522 may not necessarily be formed.

Figure 3B:
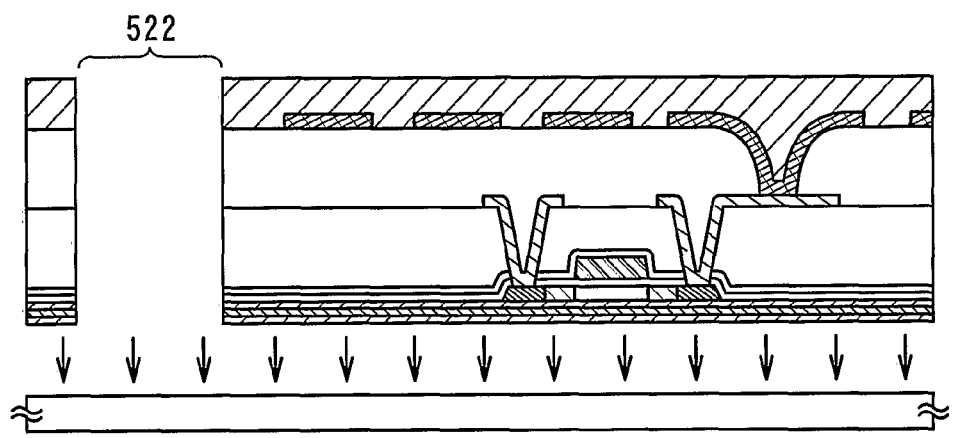

As shown in FIG. 3B, the separation layer 501 is removed by etching. In the embodiment mode, halide is used as an etching gas and it is introduced through the groove 522. For example, $ClF_3$ (chlorine trifluoride) is employed, and etching is carried out under the conditions as follows: a temperature is set to be 350° C.; a flow rate, 300 sccm; a pressure, 6 Torr; and time, 3 hours. Or, $ClF_3$ gas mixed with nitrogen may be used. By using the halide such as $ClF_3$, $NF_3$ (nitrogen trifluoride), $BrF_3$ (bromine trifluoride) and HF (hydrogen fluoride), the separation layer 501 is selectively etched so that the first substrate 500 can be separated from the TFT 504. In case of using HF, a silicon oxide film is employed as the separation layer. Note that the halide may be either a gas state or a solid state.

Figure 3C:
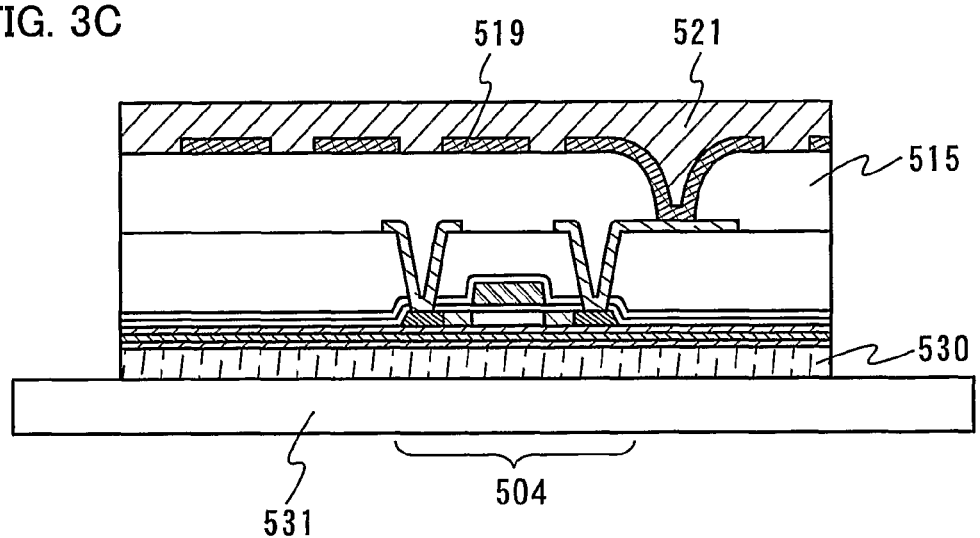

As shown in FIG. 3C, the separated TFT 504 and the antenna 519 are attached to a second substrate 531 with an adhesive agent 530. A material that can attach the second substrate 531 and the sealing film 502 to each other is employed for the adhesive agent 530. As the adhesive agent 530, for example, various types of curing adhesive agents including a reactive curing adhesive agent, a thermal curing adhesive agent, a light curing adhesive agent such as an ultraviolet curing adhesive agent, an anaerobic curing adhesive agent and the like can be used.

With respect to the second substrate 531, a flexible organic material such as a paper and plastics can be used. In addition, a flexible inorganic material can be employed. As a plastic substrate, ARTON made from polynorbornene with a polar radical (which is manufactured by JSR Corporation) can be used. Also, the following materials can be cited as the plastic substrate: polyester typified by polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyarylate (PAR), polybutylene terephthalate (PBT), polyimide, acrylonitrile butadiene styrene resin, polyvinyl chloride, polypropylene, polyvinyl acetate, acrylic resin and the like. The second substrate 531 desirably has good thermal conductivity of about 2 to 30 W/mK in order to diffuse the heat generated from the integrated circuit.

As shown in FIG. 4A, after removing the protective layer 521, an adhesive agent 532 is applied over the second interlayer insulating film 515 so as to cover the antenna 519, and then a cover member 533 is attached to the second substrate

531. As well as the second substrate 531, a flexible organic material such as a paper and plastics can be used as the cover member 533. The thickness of the adhesive agent 532 may be, for example, set to be 10 to 200 μm.

A sealing film 540 is formed over the surface of the cover member 533 in advance. In the embodiment mode, the sealing film 540 is formed by sequentially laminating a barrier film 540a, a stress relaxation film 540b and a barrier film 540c over the cover member 533. The structure and the method of manufacturing the barrier film 540a, the stress relaxation film 540b and the barrier film 540c can refer the description about the sealing film 502, and will not be further explained. The cover member 533 is attached to the second interlayer insulating film 515 such that the sealing film 540 is sandwiched between the cover member 533 and the TFT 504.

As for the adhesive agent 532, a material capable of attaching the cover member 533 to the second interlayer insulating film 515 and the antenna 519 is employed. For example, various kinds of curing adhesive agents including a reactive curing adhesive agent, a thermal curing adhesive agent, a light curing adhesive agent such as an ultraviolet curing adhesive agent, an anaerobic curing adhesive agent and the like can be used.

According to the foregoing respective steps, the ID chip is completed. In accordance with the above manufacturing method, the drastically thin integrated circuit with a thickness in a range of 0.3 μm to 3 μm in total, typically, about 2 μm can be formed between the second substrate 531 and the cover member 533. Note that the thickness of the integrated circuit includes not only the thickness of the semiconductor element itself but also the thicknesses of the various types of an insulating film and an interlayer insulating film that are formed between the adhesive agent 530 and the adhesive agent 532. The dimension of the integrated circuit for the ID chip can be set to be 5 mm square (25 mm$^2$) or less, more desirably, in a range of about 0.3 mm square (0.09 mm$^2$) to 4 mm square (16 mm$^2$).

When the integrated circuit is centrally-placed between the second substrate 531 and the cover member 533, the mechanical strength of the ID chip can be enhanced. Concretely, when a distance between the second substrate 531 and the cover member 533 is set to be "d", the thicknesses of the adhesive agent 530 and the adhesive agent 532 are preferably controlled such that a distance between the second substrate 531 and the center of the integrated circuit in the thickness direction satisfies the expression 1 as follows:

$$d/2-30 \text{ μm} < x < d/2+30 \text{ μm} \quad \text{[Expression 1]}$$

Or, the thicknesses of the adhesive agent 530 and the adhesive agent 532 are controlled so as to satisfy the following expression 2:

$$d/2-10 \text{ μm} < x < d/2+10 \text{ μm} \quad \text{[Expression 2]}$$

In the case where a serial number is stamped into a semiconductor film, an insulating film and the like that are included in an ID chip, when the ID chip is illegally flowed into the hands of a third party by theft etc. before data in the ID chip is stored in a ROM, the distribution route thereof can trace to some extent by the serial number. In this case, it is more effective that the serial number be stamped on a part such that the serial number is hardly deleted only when a semiconductor device is disassembled irreparably and unable to be restored.

Although FIG. 4A shows an example using the cover member 533, the present invention is not limited to the configuration. For instance, after completion up to the step as shown in FIG. 3C, the sealing film 541 may be formed so as to cover the protective layer 521 without removing the protective layer 521, as shown in FIG. 4B. The sealing film 541 is formed by sequentially laminating a barrier film 541a, a stress relaxation film 541b and a barrier film 541c over the protective layer 521. The structure and manufacturing method of the barrier film 541a, the stress relaxation film 541b and the barrier film 541c can refer the description about the sealing film 502, and will not be further explained.

The method for separating the integrated circuit from the first substrate 500 is not particularly limited to the etching with use of a silicon film, and other various kinds of methods can be employed. For example, a metal oxide film may be formed between the high heat resistant substrate and the integrated circuit and the metal oxide film is crystallized to be weakened so as to separate the integrated circuit from the substrate. Or, for example, the separation layer may be destroyed by being irradiated with laser beam so that the integrated circuit is separated from the substrate. Or, for instance, the substrate over which the integrated circuit is formed may be mechanically removed or eliminated by etching using a solution or a gas so as to separate the integrated circuit from the substrate.

When an organic resin is used as the adhesive agent 530 that is in contact with the sealing film 502 to secure the flexibility of the ID chip, the barrier films 502a and 502c included in the sealing film 502 are made from silicon nitride films or silicon nitride oxide films, thereby preventing dispersion of the alkali metal such as Na and alkali earth metal from the organic resin into the semiconductor film.

When an object has a curved surface and the ID chip that is attached to the object, the second substrate of the ID chip is also curved so as to have a curved surface drawn by shifting a generating line such as a conical surface and a cylindrical surface. In this case, the direction of the generating line and the direction of moving carriers are desirably uniformed. This structure can prevent the characteristics of the TFT from being adversely affected by curving the second substrate. When the rate of the area for the island-like semiconductor film within the integrated circuit is set to be 1 to 30%, it is possible to suppress the adverse affect of the characteristics for the TFT, even if the second substrate is curved.

Although the example in which the antenna and the integrated circuit are formed over the same substrate is shown in the embodiment mode, the present invention is not limited to the configuration. Alternatively, an antenna and an integrated circuit that are formed over different substrates may be attached to each other such that the antenna and the integrated circuit are electrically connected to each other.

Also, the example in which the sealing film 502 and the integrated circuit are both separated and attached to the substrate is shown in the embodiment mode, however, the present invention is not limited to the configuration. A sealing film may be formed over the subject substrate in advance to be attached with the integrated circuit. In this case, an insulating film (a base film) is formed between the separation layer and the semiconductor element so as to prevent the alkali metal or alkali earth metal from intruding into the semiconductor film included in the semiconductor element and protect the semiconductor element in the separating step.

Figure 14:
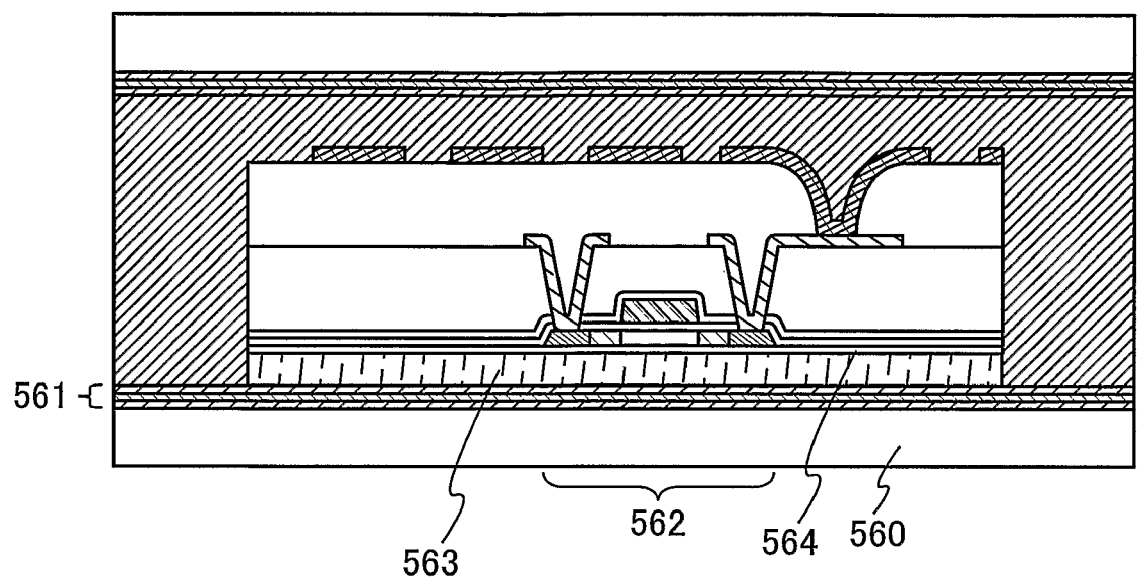
FIG. 14 is a cross sectional view of an ID chip according to the invention.

FIG. 14 is a cross sectional view showing one mode of an ID chip in the case where a sealing film is formed in advance over the subject substrate to be attached with the integrated circuit. When a sealing film 561 is previously formed over the substrate 560 as shown in FIG. 14, an adhesive agent 563 is provided between a TFT 562 of the integrated circuit and the sealing film 561 to attach the TFT 562 and the sealing film 561 to each other. A base film 564 is next formed between the TFT 562 and the adhesive agent 563 to prevent dispersion of the alkali metal or alkali earth metal that are contained in the adhesive agent 563 into the semiconductor film used in the semiconductor element and protect the TFT 562 in the separating step. The base film 564 is formed of an inorganic film that can prevent the alkali metal such as Na, alkali earth metal, moisture and the like from dispersing into the semiconductor film included in the semiconductor element. For instance, silicon nitride, silicon nitride oxide, aluminum oxide, aluminum nitride, aluminum nitride oxide, aluminum silicon nitride oxide and the like can be used as the base film 564. Note that the base film 564 may be formed using a single insulating film or plural insulating films. When the base film 564 is formed using plural insulating films, one of the plural insulating films may be the above-mentioned inorganic insulating film.

In addition, another sealing film may be formed between the separation layer and the semiconductor element in addition to the base film formed over the subject substrate to be attached with the integrated circuit.

The method for separating the integrated circuit from the high heat resistant substrate by providing the separation layer between the high heat resistant substrate and the integrated circuit and removing the separation layer by etching is shown in the embodiment mode, however, the method for manufacturing the ID chip according to the invention is not limited thereto. For example, a metal oxide film may be provided between the high heat resistant substrate and the integrated circuit and the metal oxide film may be crystallized to be weakened so that the integrated circuit is separated from the substrate. Or, a separation layer made from an amorphous semiconductor film containing hydrogen is provided between the high heat resistant substrate and the integrated circuit and the separation layer is removed by irradiation with laser beam so that the integrated circuit may be separated from the substrate. Or, the high heat resistant substrate over which the integrated circuit is formed may be mechanically removed or eliminated by etching using a solution or a gas so that the integrated circuit may be separated from the substrate.

Electric waves with the frequency of 13.56 MHz or 2.45 GHz are generally used for the ID chip. It is very important that the ID chip be formed to detect the radio waves with the foregoing frequency from the viewpoint of enhancing the versatility.

As compared with an ID chip formed using a semiconductor substrate, the radio waves are hardly blocked in the ID chip of the embodiment mode so that the ID chip of the embodiment mode has an advantage of preventing attenuation of signals due to block of the radio waves. Since the semiconductor substrate is not used, manufacturing cost of the ID chip can be drastically reduced. For instance, the case of using a silicon substrate with 12 inches and the case of using a glass substrate with a dimension of 730×920 mm$^2$ will be compared as follows. The dimension of the silicon substrate is about 73,000 mm$^2$ while the dimension of the glass substrate is about 672,000 mm$^2$, and therefore, the dimension of the glass substrate is about 9.2 times as large as that of the silicon substrate. In the glass substrate with the dimension of about 672,000 mm$^2$, approximately 672,000 of ID chips with 1 mm square are produced regardless of the areas where are consumed by dividing the substrate. The production number is about 9.2 times as large as that of the silicon substrate. Since the case of using the glass substrate with 730×920 mm$^2$ requires less number of steps as compared with the case of using the silicon substrate with 12 inches, investment cost in facilities can be reduced about three times. According to the invention, the glass substrate can be reused after separating the integrated circuit therefrom. The cost can be reduced significantly as compared with the case of using the silicon substrate that cannot be reused even if cost for repairing a cracked glass substrate or cleaning the surface of a glass substrate is taken into consideration. If the glass substrate is not reused and is discarded, since the price of the glass substrate with 730×920 mm$^2$ is about half of the price of the silicon substrate with 12 inches, the cost of manufacturing ID chips can be drastically reduced.

As a consequence, in the case of using the glass substrate with 730×920 mm$^2$, it is appreciated that the price of an ID chip can be suppressed thirtieth lower than that of an ID chip formed using the silicon film with 12 inches. The use of the ID chip as premises for a disposable one has been expected, and hence, the ID chip according to the invention that can be formed by reducing manufacturing cost drastically is very useful for the above purpose.

Embodiment 1

In the embodiment, a method for manufacturing an ID chip in which an antenna and an integrated circuit that are formed over different substrates are electrically connected to each other will be described, differing from FIGS. 2A to 2D, FIGS. 3A to 3C, and FIGS. 4A and 4B.

After forming the second interlayer insulating film 515 with an opening as shown in FIG. 2C, a wiring 550 connected to the wiring 514 is formed so as to be in contact with the second interlayer insulating film 515 as shown in FIG. 5A. A protective layer 551 is formed over the second interlayer insulating film 515 so as to cover the wiring 550. The structure and the manufacturing method of the protective layer 551 can refer the descriptions with respect to the protective layer 521 as shown in FIG. 2D.

A groove 552 is next formed to separate the ID chips one another. As shown in FIG. 5B, the separation layer 501 is removed by etching. The specific method for forming the groove 552 and the concrete method for etching the separation layer 501 are already shown referring to FIGS. 3A and 3B, and will not be further explained.

As shown in FIG. 5C, the separated TFT 504 is attached to a second substrate 554 with an adhesive agent 553. A material capable of attaching the second substrate 554 to the sealing film 502 is used as the adhesive agent 553. As for the adhesive agent, various types of curing adhesive agents including a reactive curing adhesive agent, a thermal curing adhesive agent, a light curing adhesive agent such as an ultraviolet curing adhesive agent, an anaerobic curing adhesive agent and the like can be used.

After removing the protective layer 551, an adhesive agent 558 is applied over the second interlayer insulating film 515 so as to cover the wiring 550, and a cover member 555 is attached thereto. The cover member 555 may be formed of a flexible organic material such as a paper and plastics as well as the second substrate 554.

A sealing film 556 and an antenna 557 are previously formed over the cover member 555. In the embodiment, the sealing film 556 is formed by sequentially laminating a barrier film 556a, a stress relaxation film 556b and a barrier film 556c over the cover member 555. The structure and the manufacturing method of the barrier film 556a, the stress relaxation film 556b and the barrier film 556c can refer to the descriptions with respect to the sealing film 502, and will not be further explained. The cover member 555 is attached to the second interlayer insulating film 515 such that the sealing film 556 is sandwiched between the cover member 555 and the TFT 504.

The antenna 557 is formed opposite side of the sealing film 556 over the cover member 555. The antenna 557 is partly exposed through the contact hole that is formed in the cover member 555 and the sealing film 556. An anisotropic conductive resin is used as an adhesive agent 558 to connect the antenna 557 and the wiring 550 to each other electrically.

The anisotropic conductive resin is a material in which a conductive material is dispersed in a resin. As the resin, for example, the followings can be used: a thermal curing resin such as an epoxy resin, an urethane resin, and an acrylic resin, a thermoplastic resin such as a polyethylene resin and a polypropylene resin, a siloxane resin and the like. As the conductive material, for example, a plastic particle such as polystyrene and epoxy that is coated with Ni, Au or the like; Ni; Au; Ag; a metal particle such as solder; particulate or fibrous carbon; fibrous Ni coated with Au and the like can be used. The size of the conductive material is desirably determined in accordance with the pitch between the antenna 557 and the wiring 550.

The antenna 557 and the wiring 550 may be pressed to be attached to each other by applying ultrasonic waves to the anisotropic conductive resin or pressed to be attached to each other by curing the anisotropic conductive resin due to irradiation of ultraviolet light.

Although the present embodiment shows the example of electrically connecting the antenna 557 and the wiring 550 with the adhesive agent 558 made from the anisotropic conductive resin, the present invention is not limited to the configuration. As substitute for the adhesive agent 558, an anisotropic conductive film may be used to electrically connect the antenna 557 to the wiring 550 by pressing the anisotropic conductive film.

The example in which the sealing film 502 and the integrated circuit are both separated and attached to the substrate is shown in the embodiment, however, the invention is not limited to the configuration. The sealing film may previously be formed over the subject substrate to be attached with the integrated circuit. In this case, an insulating film (a base film) is formed between the separation layer and the semiconductor element so as to prevent ingress of the alkali metal or alkali earth metal into the semiconductor film included in the semiconductor element and protect the semiconductor element in the separation step. Or, another sealing film may be formed between the separation layer and the semiconductor element in addition to the sealing film formed in advance over the subject substrate to be attached with the integrated circuit.

Further, although the embodiment shows the example in which the separation layer is provided between the high heat resistant substrate and the integrated circuit so that the integrated circuit is separated from the substrate by removing the separation layer by etching, the manufacturing method of the invention is not limited to the configuration. For example, a metal oxide film is formed between the high heat resistant substrate and the integrated circuit and the metal oxide film is crystallized to be weakened so as to separate the integrated circuit from the substrate. Or, a separation layer made from an amorphous semiconductor film containing hydrogen may be provided between the high heat resistant substrate and the integrated circuit and the integrated circuit may be separated from the substrate by removing the separation layer with irradiation of laser beam. Or, the high heat resistant substrate over which the integrated circuit is formed may be mechanically removed or eliminated by etching using a solution or a gas to separate the integrated circuit therefrom.

Figure 15:
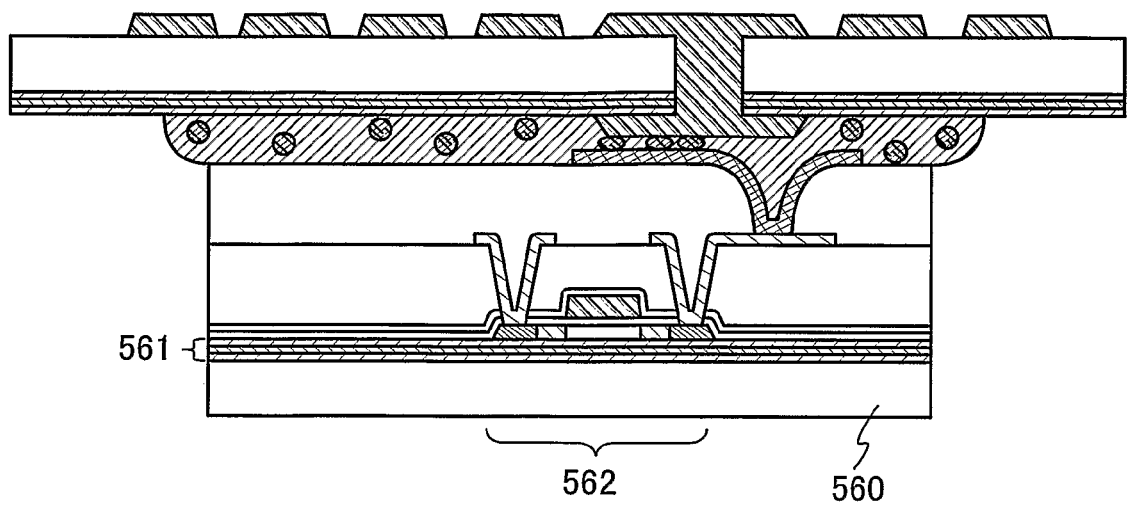
FIG. 15 is a cross sectional view of an ID chip according to the invention.

Although the embodiment shows the example in which the integrated circuit is separated from the high heat resistant substrate and attached to the flexible substrate, the present invention is not limited to the configuration. When using a substrate that can withstand heat treatment in the step of manufacturing the integrated circuit, the integrated circuit is not necessarily separated. FIG. 15 is a cross sectional view showing one mode of the ID chip that is formed by using a glass substrate.

With respect to the ID chip shown in FIG. 15, a glass substrate is used as a substrate 560, and a sealing film 561 is formed between a TFT 562 used for an integrated circuit and the substrate 560 without sandwiching an adhesive agent therebetween. In the structure, there is no possibility that the alkali metal such as Ni, alkali earth metal, moisture and the like penetrate into a semiconductor film included in a semiconductor element.

Embodiment 2

Figure 6A:
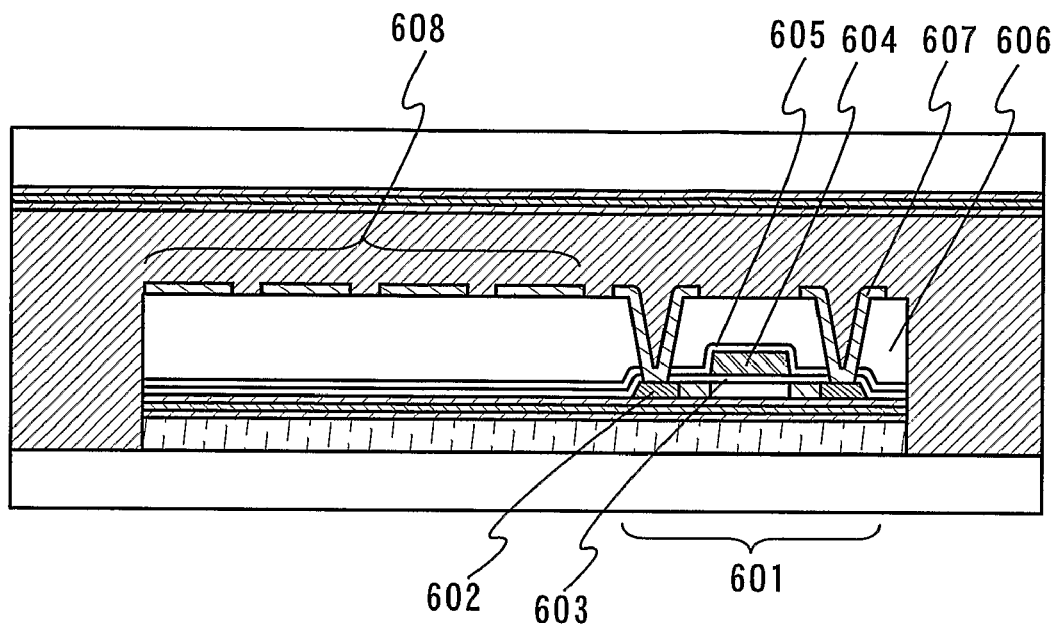
FIGS. 6A and 6B are cross sectional views of ID chips according to the invention.

A structure of an ID chip in the case of forming a wiring connected to a TFT and an antenna by patterning one conductive film will be explained. FIG. 6A is a cross sectional view of the ID chip according to the present embodiment.

In FIG. 6A, reference numeral 601 denotes a TFT. The TFT 601 includes a semiconductor film 602, a gate insulating film 603 for covering the semiconductor film 602 and a gate electrode 604 that overlaps with the semiconductor film 602 while sandwiching the gate insulating film 603 therebetween. The TFT 601 is covered with a passivation film 605 and a first interlayer insulating film 606. A wiring 607 formed on the first interlayer insulating film 606 is connected to the semiconductor film 602 via the gate insulating film 603, the passivation film 605 and the first interlayer insulating film 606.

An antenna 608 is formed on the first interlayer insulating film 606. The wiring 607 and the antenna 608 can be made together by forming a conductive film on the first interlayer insulating film 606 and patterning the conductive film into the respective patterns. By forming the antenna 608 along with the wiring 607 using the same conductive film, the number of steps for manufacturing the ID chip can be reduced.

Embodiment 3

Figure 6B:
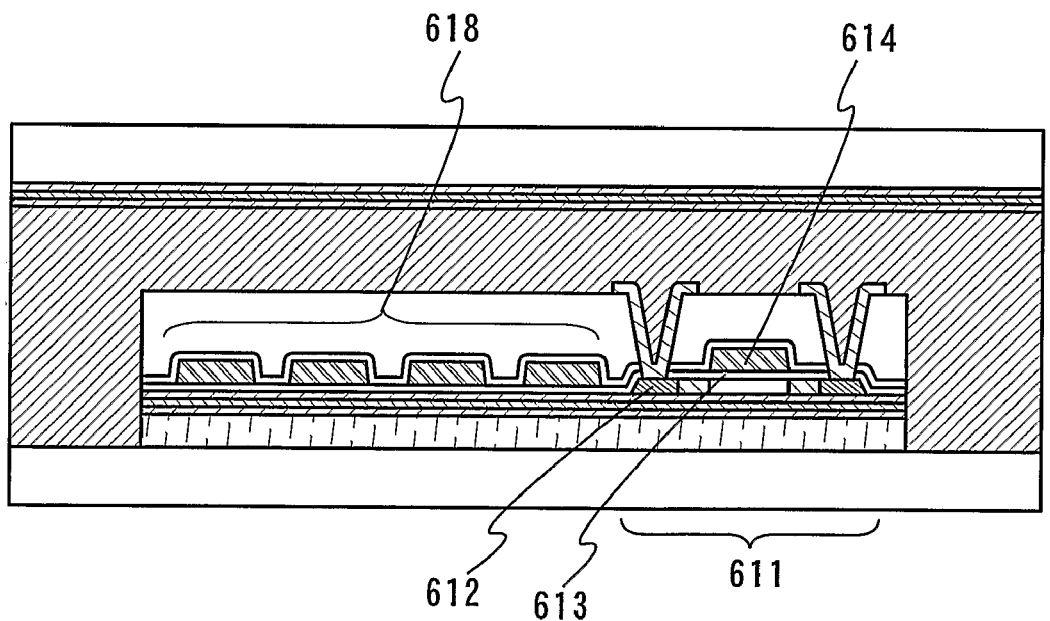

A structure of an ID chip in the case of forming a gate electrode of a TFT along with an antenna by patterning one conductive film will be explained in the embodiment. FIG. 6B is a cross sectional view of the ID chip according to the present embodiment.

In FIG. 6B, reference numeral 611 denotes a TFT. The TFT 611 includes a semiconductor film 612, a gate insulating film 613 covering the semiconductor film 612 and a gate electrode 614 that overlaps with the semiconductor film 612 while sandwiching the gate insulating film 613 therebetween. An antenna 618 is formed on the gate insulating film 613. The gate electrode 614 and the antenna 618 can be made together by forming a conductive film on the gate insulating film 613 and patterning the conductive film into the respective patterns. By forming the antenna 618 and the gate electrode 614 together, the number of steps for manufacturing the ID chip can be reduced.

Embodiment 4

In the present embodiment, a method for manufacturing plural ID chips with use of a large size substrate will be described.

Figure 7A:
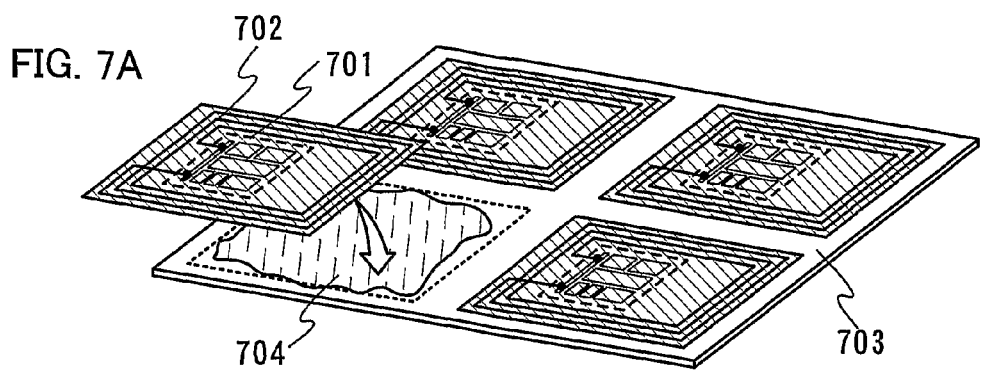
FIGS. 7A to 7D are diagrams showing a method of manufacturing a plurality of ID chips of the invention by using a large size substrate.

Integrated circuits 701 and antennas 702 are formed over a heat resistant substrate, respectively. The integrated circuits 701 and the antennas 702 are both separated from the heat resistant substrate and attached to a substrate 703 that is separately prepared with an adhesive agent 704 as shown in FIG. 7A. Although FIG. 7A shows a state in which plural pairs of the integrated circuits 701 and the antennas 702 are respectively attached to the substrate 702, the present invention is not limited to the configuration. Alternatively, the integrated circuits 701 and the antennas 702 each of which is connected to one another may be separated at once and attached to the substrate 703.

Figure 7B:
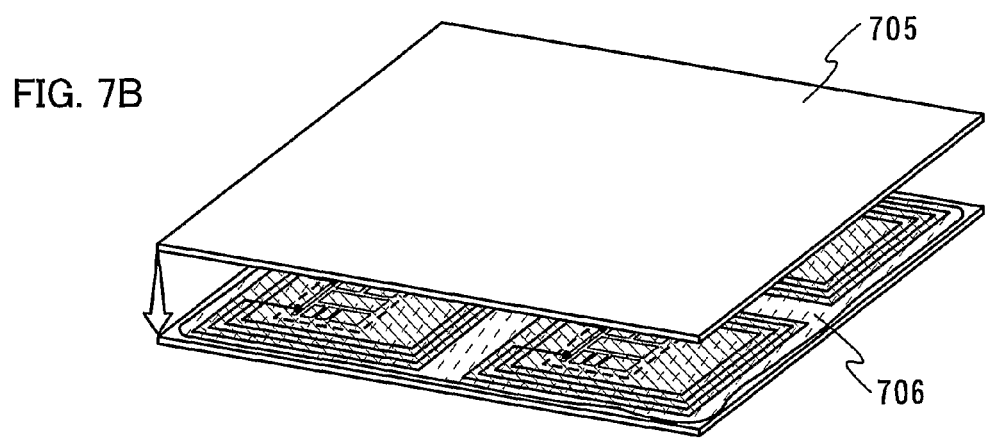
Figure 7C:
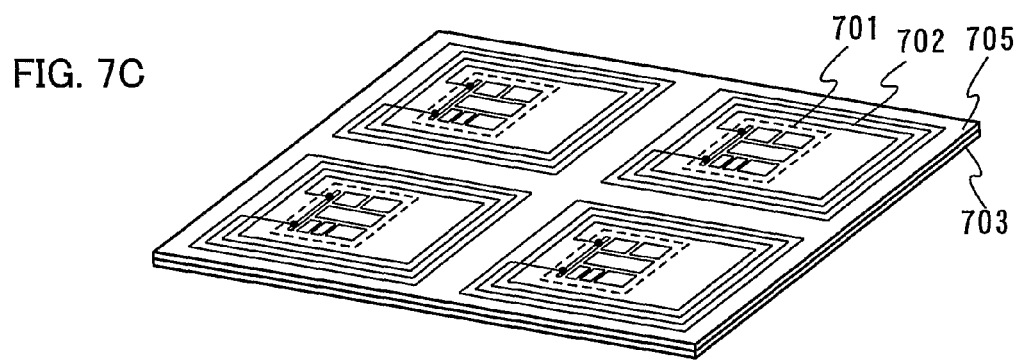

As shown in FIG. 7B, a cover member 705 is attached to the substrate 703 such that the integrated circuits 701 and the antennas 702 are sandwiched therebetween. At this moment, an adhesive agent 706 is applied over the substrate 703 so as to cover the integrated circuits 701 and the antennas 702. By attaching the cover member 705 to the substrate 703, the state as shown in FIG. 7C is obtained. Note that the integrated circuits 701 and the antennas 702 are illustrated such that they are transparent through the cover member 705 in order to show the positions of the integrated circuits and the antennas clearly.

Figure 7D:
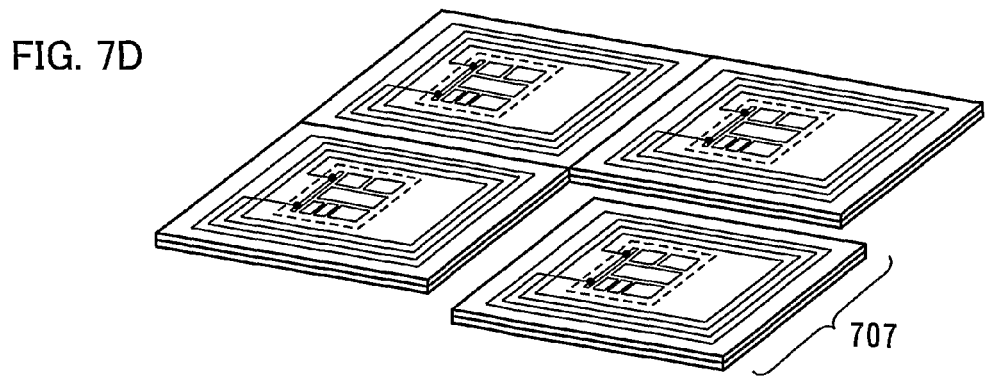

As shown in FIG. 7D, the integrated circuits 701 and the antennas 702 are isolated to one another by dicing or scribing, thereby achieving ID chips 707.

The present embodiment shows the example of separating the antennas 702 along with the integrated circuits 701, however, the embodiment is not limited to the configuration. The antennas may be formed over the substrate 703 in advance and the integrated circuits 701 may be attached to the substrate such that the integrated circuits and the antennas are electrically connected to each other. Or, after attaching the integrated circuits 701 to the substrate 703, the antennas may be attached to the substrate such that they are electrically connected to the integrated circuits. Or, the antennas may be formed over the cover member 705 in advance and the substrate 703 over which the integrated circuits are formed may be attached to the cover member such that the integrated circuits and the antennas are electrically connected to each other.

Figure 8:
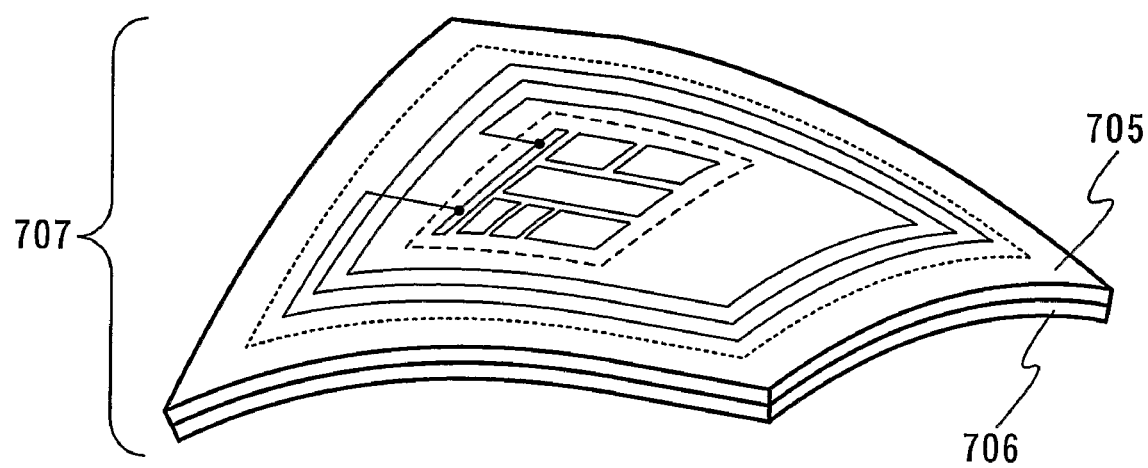
FIG. 8 is an external view of an ID chip that becomes stressed.

When the substrate 703 and the cover member 705 are flexible, the ID chips 707 can be used while being stressed as shown in FIG. 8. In the invention, the use of the stress relaxation film can allow pressure applied to the respective ID chips 707 to alleviate to some extent. In addition, by providing plural barrier films, stress for each barrier film can be suppressed so that adverse effect to the characteristics of the semiconductor element due to dispersion of the alkali metal, the alkali earth metal or moisture into the semiconductor element can be prevented.

Note that the ID chip using a glass substrate can be referred to as an IDG chip (identification glass chip) whereas the ID chip using a flexible substrate can be referred to as an IDF chip (identification flexible ship).

Embodiment 5

The present embodiment will explain a mode of a functional structure with respect to the ID chip according to the invention.

Figure 9:
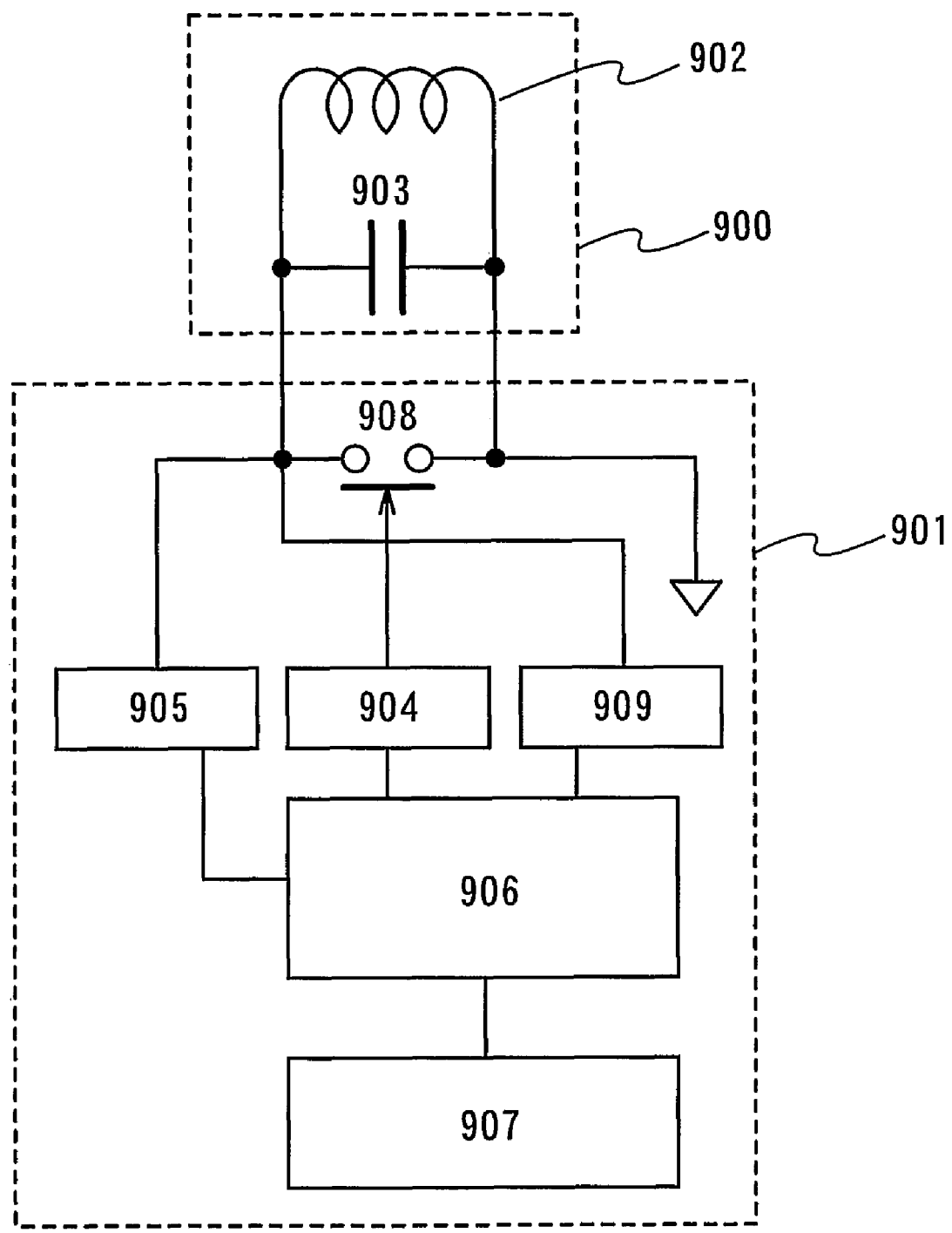
FIG. 9 is a block diagram showing one mode of an ID chip with a functional structure according to the invention.

In FIG. 9, reference numeral 900 denotes an antenna; and 901, an integrated circuit. The antenna 900 includes an antenna coil 902 and a capacitor element 903 formed inside the antenna coil 902. The integrated circuit 901 comprises a demodulation circuit 909, a modulation circuit 904, a rectification circuit 905, a microprocessor 906, a memory 907 and a switch 908 for applying load modulation to the antenna 900. Plural memories may be employed instead of using one memory 907. SRAMs, flash memories, ROMs, FRAMs (registered trademark) or the like can be used.

Signals sent from a reader/writer as radio waves are modulated into alternating-current electric signals in the antenna coil 902 by electromagnetic induction. The alternating-current electric signals are demodulated in the demodulation circuit 909 and the demodulated signals are transmitted to the subsequent stage microprocessor 906. A supply voltage is generated in the rectification circuit 905 by utilizing the alternating-current electric signals to supply to the subsequent stage microprocessor 906.

In the microprocessor 906, various kinds of arithmetic processings are performed in accordance with the input signals. The memory 907 is stored with programs, data and the like that are used in the microprocessor 906, and it can also be used as a work area in arithmetic processing. The signals sent to the modulation circuit 904 from the microprocessor 906 are modulated into alternating-current electric signals. The switch 908 can apply load modulation to the antenna coil 902 according to the alternating-current electric signals from the modulation circuit 904. The reader/writer receives load modulation applied to the antenna coil 902 by radio waves so that it can read the signals from the microprocessor 906.

The ID chip of the invention is not necessary to have the antenna 900. When an ID chip does not have the antenna 900, a connection terminal for electrically connecting to the antenna 900 is provided to the ID chip.

Note that FIG. 9 only shows one embodiment of the ID chip used as a test object in an inspection apparatus of the invention, and the present invention is not limited to the foregoing configuration. The method for transmitting signals is not limited to the electromagnetic induction method as shown in FIG. 9, and other transmitting methods such as the electromagnetic coupling method and microwave method can be used.

This embodiment can be implemented by being freely combined with Embodiments 1 to 4.

Embodiment 6

Figure 10A:
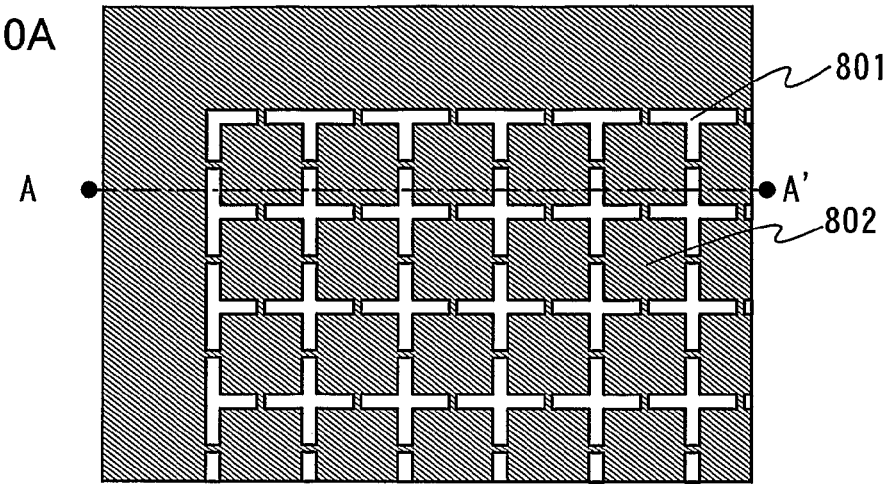
FIGS. 10A and 10C are top views and FIGS. 10B and 10D are cross sectional views showing the shape of grooves, which are formed for separating a plurality of integrated circuits formed over a substrate.
Figure 10B:
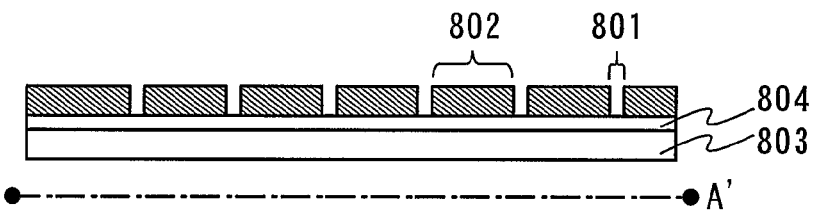

The embodiment will explain a shape of grooves formed in separating plural integrated circuits that are formed over a substrate. FIG. 10A illustrates a top view showing a substrate 803 over which grooves 801 are formed. FIG. 10B is a cross sectional view taken along a line A-A' of FIG. 10A.

Integrated circuits 802 are formed on a separation layer 804 and the separation layer 804 is formed on the substrate 803. The grooves 801 are formed between the respective integrated circuits 802 and have a certain degree of the depth to expose the separation layer 804. The plural integrated circuits 802 are partly separated from one another by the grooves 801 rather than separating completely.

Figure 10C:
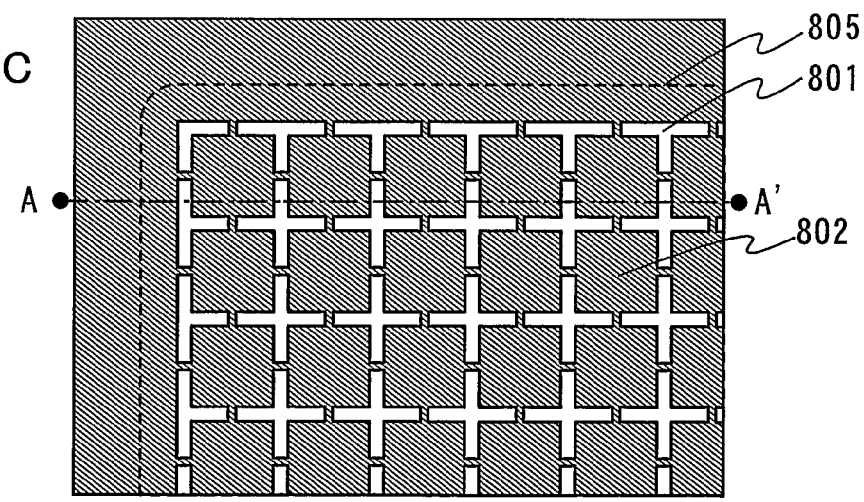
Figure 10D:
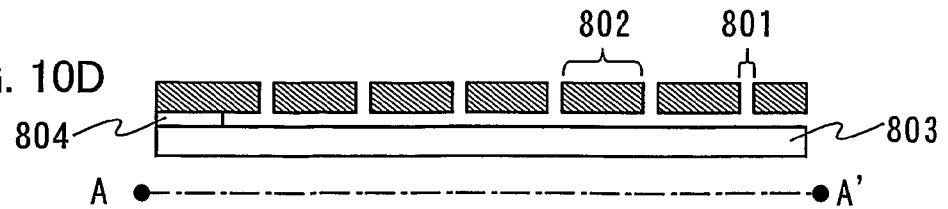

An etching gas flows through the grooves 801 as shown in FIGS. 10A and 10B to remove the separation layer 804 by etching. The condition after the etching is depicted in FIGS. 10C and 10D. FIG. 10C corresponds to a top view of the substrate 803 over which the grooves 801 are formed while FIG. 10D corresponds to a cross sectional view taken along a line A-A' of FIG. 10C. FIG. 10C shows a state in which the separation layer 804 is etched inside of a region surrounded by a dashed line. As shown in FIGS. 10C and 10D, the plural integrated circuits 802 are partly separated from one another by the grooves 801 while they are partly connected to one another so that the respective integrated circuits can be prevented from being moved due to lack of support after etching the separation layer 804.

After completing the condition as shown in FIGS. 10C and 10D, a tape attached with an adhesive agent, another substrate and the like are separately provided to separate the plural integrated circuits 802 from the substrate 803. The separated plural integrated circuits 802 are attached to a support medium before or after separating to one another.

The embodiment mode shows the example of manufacturing the ID chips, and the method of manufacturing the ID chips according to the invention is not limited thereto.

This embodiment can be implemented by being freely combined with Embodiments 1 to 5.

Embodiment 7

The present embodiment will explain application of ID chips according to the invention.

When the ID chips of the invention are formed using flexible substrates, they are preferably attached to objects having flexibility or a curved face. When memories such as ROMs that cannot be rewritten are formed inside of integrated circuits included in the ID chips of the invention, forgery of objects attached with the ID chips can be prevented. For example, the application of the ID chips of the invention to foods in which their commodity values largely depend on production areas and producers is advantageous to inhibit mislabeling of the production areas and producers with low cost.

Concretely, the ID chips of the invention can be used while being attached with tags having information about objects such as luggage tags, price tags and name tags. Also, the ID chips themselves of the invention can be utilized as such tags. For example, the ID chips may be attached to certificates corresponding to documents that prove facts such as family registers, certificates of residence, passports, licenses, identification cards, member's cards, surveyor's certificates, credit cards, cash cards, prepaid cards, consultation cards and commuter passes. In addition, for instance, the ID chips may be attached to portfolios corresponding to certificates that show property rights in private law such as handprints, checks, carriage notes, cargo certificates, warehouse certificates, stock certificates, bond certificates, tokens and deeds of mortgage.

Figure 11A:
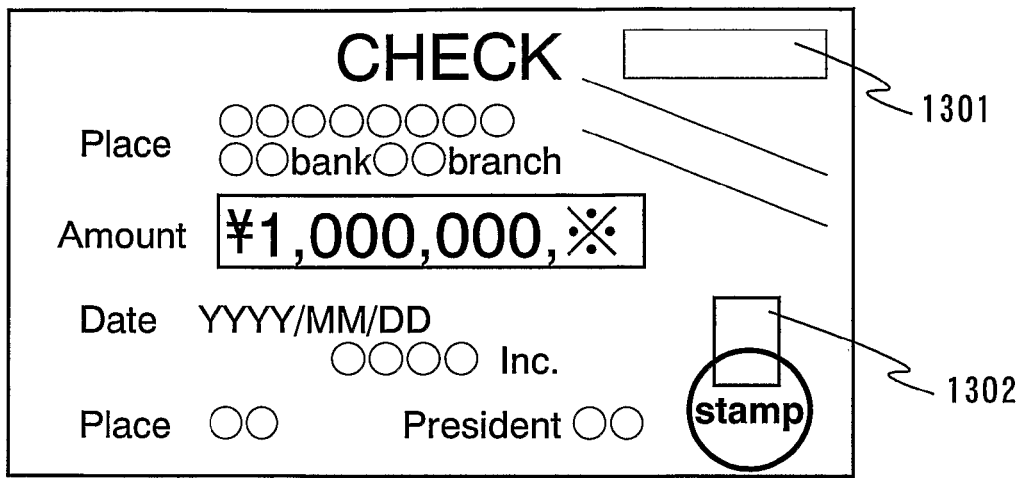
FIGS. 11A to 11C are diagrams showing examples of application for an ID chip according to the invention.

FIG. 11A shows an example of a check 1301 attached with an ID chip 1302 of the invention. Although the ID chip 1302 is attached to inside of the check 1301 in FIG. 11A, it may be provided on the surface of the check and exposed.

Figure 11B:
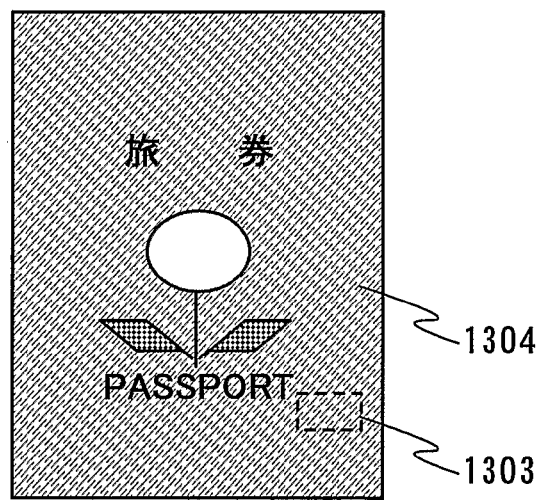

FIG. 11B shows an example of a passport 1304 attached with an ID chip 1303 of the invention. Although the ID chip 1303 is attached to the front page of the passport 1304 in FIG. 11B, it may be attached to another page of the passport.

Figure 11C:

FIG. 11C shows an example of a token 1306 attached with an ID chip 1305 of the invention. The ID chip 1305 may be attached to either inside of the token 1306 or on the face thereof to be exposed.

The ID chips of the invention using integrated circuits with TFTs are inexpensive and thin, and hence, the ID chips are suitable to applications in that the ID chips are eventually discarded by consumers. In particular, when the ID chips are applied to products in which difference in price in units of several yen to several tens yen significantly affects sales, a packing material having the inexpensive, thin ID chip of the invention is very advantageous. The packing material corresponds to a support member which is formed to wrap up an object such as a plastic wrap, a plastic bottle, a tray and a capsule.

Figure 12A:
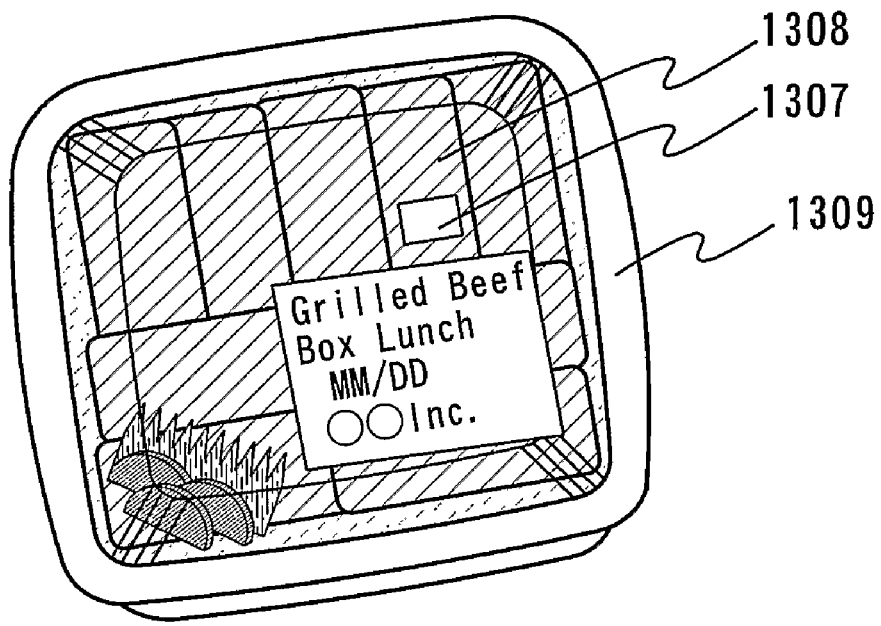
FIGS. 12A and 12B are diagrams showing examples of application for an ID chip according to the invention.

A state of packing a boxed meal 1309 offered for sale by a packing material 1308, which is attached with an ID chip of the invention, is depicted in FIG. 12A. By storing price and the like of the product in the ID chip 1307, the bill for the boxed meal can be settled in a register having functions as a reader/writer.

For example, the ID chips of the invention may be attached to labels for goods so that distribution process of the goods is managed.

Figure 12B:
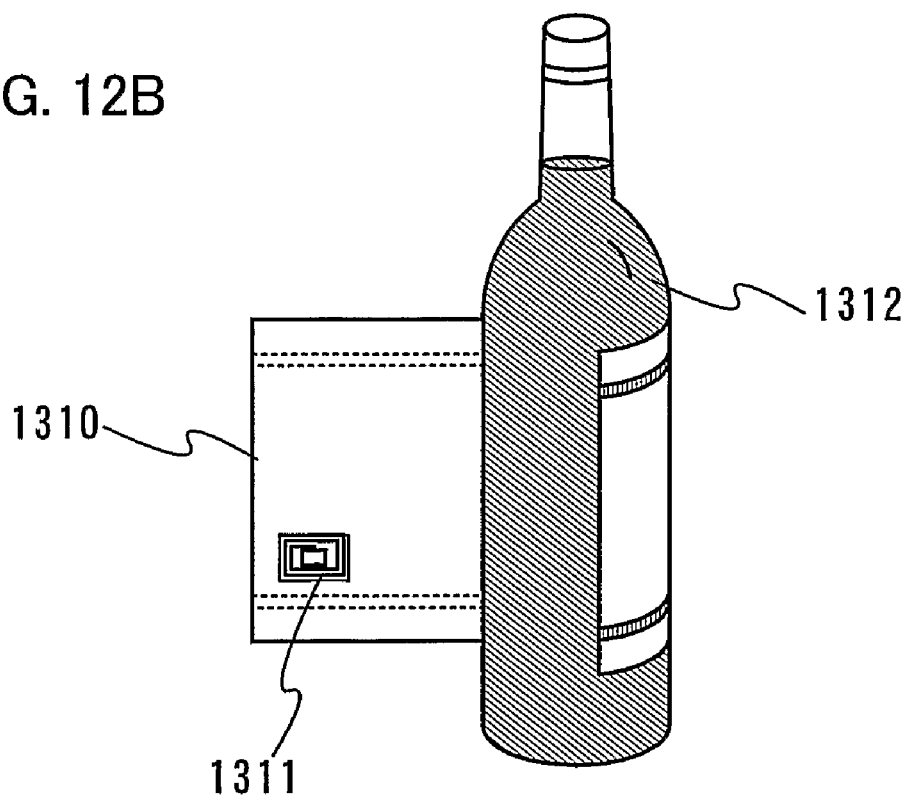

As shown in FIG. 12B, an ID chip 1311 of the invention is attached to a support medium such as a commercial product's label in that its rear face has viscosity. The label attached with the ID chip 1311 is pasted to a commercial product 1312. Identification information related to the commercial product 1312 can be read wirelessly from the ID chip 1311 attached to the label 1310. Accordingly, management of the commercial product becomes easier in the distribution process due to the ID chip 1311.

In the case of using a nonvolatile memory as a memory for an integrated circuit included in the ID chip 1311, distribution process of the commercial product 1312 can be stored. Storage of the process in the production stage for goods can allow wholesalers, retailers and consumers to grasp information about production areas, producers, dates of manufacture, processing methods and the like easily.

The present embodiment can be implemented by being freely combined with the configurations of Embodiments 1 to 6.

Embodiment 8

The present embodiment will explain configurations of TFTs used for the ID chips of the invention.

Figure 13A:
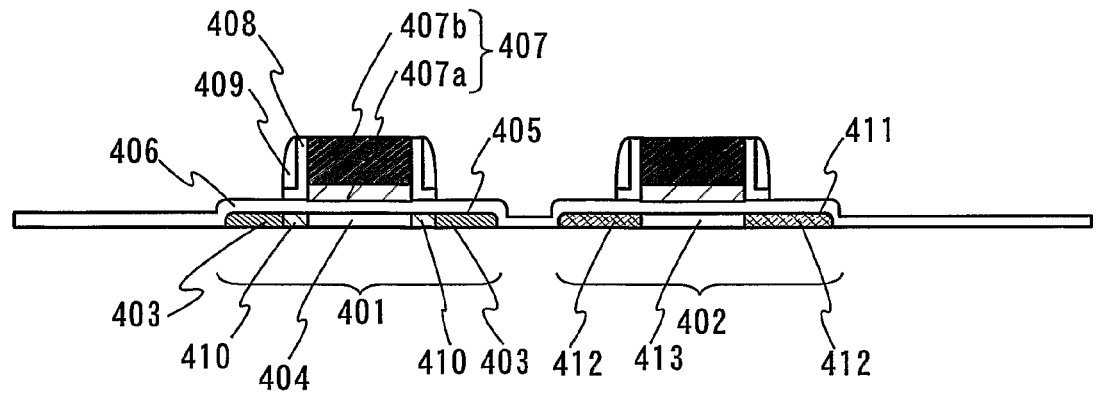
FIGS. 13A to 13D are cross sectional views showing structures of a TFT that is used in an ID chip according to the invention.

FIG. 13A shows a cross sectional view of TFTs according to the embodiment. Reference numeral 401 represents an n-channel TFT; and 402, a p-channel TFT. The configuration of the n-channel TFT 401 will be explained as an example.

The n-channel TFT 401 comprises an active layer 405. The active layer 405 includes two impurity regions 403 used as a source region and a drain region, a channel formation region 404 sandwiched between the two impurity regions 403, and two LDD (lightly doped drain) regions 410 sandwiched between the impurity regions 403 and the channel formation region. The n-channel TFT 401 further comprises a gate insulating film 406, a gate electrode 407, and two sidewalls 408 and 409 made from insulating films.

Although the gate electrode 407 includes two-layer conductive films 407a and 407b in the embodiment, the invention is not limited to the configuration. The gate electrode 407 may include a single-layer conductive film or two or more layer conductive films. The gate electrode 407 overlaps with the channel formation region 404 of the active layer 405 while sandwiching the gate insulating film 406 therebetween. The sidewalls 408 and 409 overlap with the two LDD regions 410 of the active layer 405 while sandwiching the gate insulating layer 406 therebetween.

For example, the sidewalls 408 can be formed by etching a silicon oxide film with a thickness of 100 nm whereas the sidewalls 409 can be formed by etching an LTO film (a low temperature oxide film) with a thickness of 200 nm. In the embodiment, the silicon oxide film used for the sidewalls 408 is formed by plasma CVD and the LTO film used for the sidewalls 409 is formed by reduced pressure CVD. Note that although the silicon oxide film may contain nitrogen, the number of nitrogen atoms must be set to be lower than that of oxygen atoms.

After doping an n-type impurity to the active layer 405 using the gate electrode 407 as a mask, the sidewalls 408 and 409 are formed, and an n-type impurity element is doped to the active layer 405 utilizing the sidewalls 408 and 409 as masks so that the impurity regions 403 and the LDD regions 410 can be formed separately.

The p-channel TFT 402 has almost similar configuration to the n-channel TFT 401, however, a structure of an active layer 411 of the p-channel TFT 402 is only different of that for the n-channel TFT. The active layer 411 does not have an LDD region, and includes two impurity regions 412 and a channel formation region 413 sandwiched between the impurity regions. The impurity regions 412 are doped with a p-type impurity. Although FIG. 13A illustrates an example in that the p-channel TFT 402 does not have an LDD region, the present invention is not limited to the configuration. The p-channel TFT 402 may comprise an LDD region.

Figure 13B:
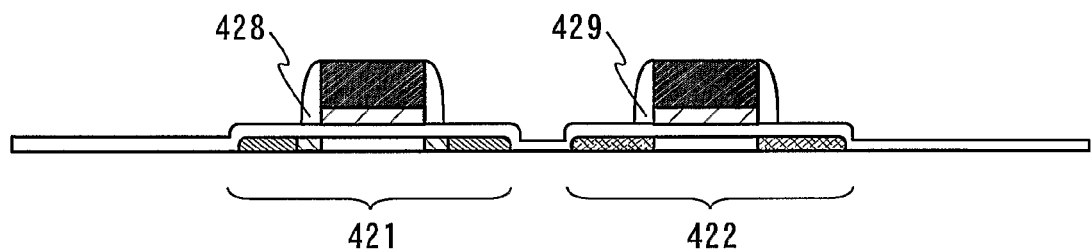

FIG. 13B shows a case wherein each TFT shown in FIG. 13A has one kind of sidewalls. An n-channel TFT 421 and a p-channel TFT 422 as shown in FIG. 13B comprise one kind of sidewalls 428 and one kind of sidewalls 429, respectively. Each sidewall can, for example, be made by etching a silicon oxide film with a thickness of 100 nm. In the embodiment, the silicon oxide film used for the sidewall 428 is formed by plasma CVD. The silicon oxide film may contain nitrogen, however, the number of nitrogen atoms must be set to be lower than that of oxygen atoms.

Figure 13C:
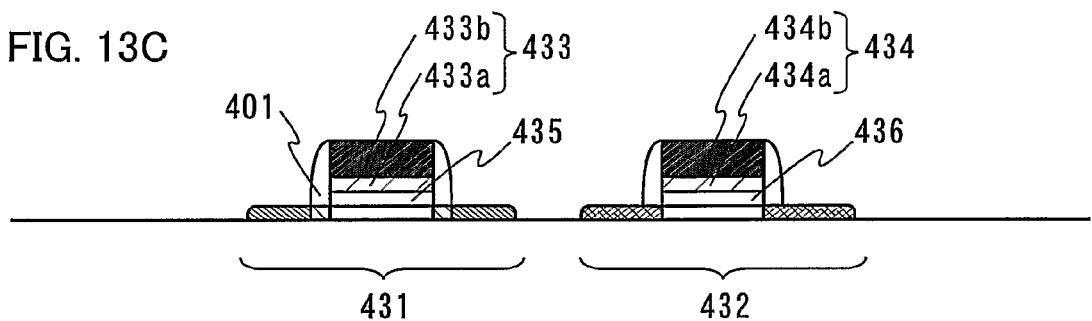

FIG. 13C shows an example in which the sidewalls are formed after etching the gate insulating films while utilizing the gate electrode as a mask with respect to the TFTs shown in FIG. 13B. An n-channel TFT 431 and a p-channel TFT 432 as shown in FIG. 13C include gate electrodes 433, 434 and gate insulating films 435, 436, respectively. The gate insulating films 435 and 436 are formed by etching while using the gate electrodes 433 and 434 as masks.

The gate electrodes 433 and 434 include two-layer conductive films 433a, 433b and two-layer conductive films 434a, 434b in the embodiment, however, the present invention is not limited to the configuration. The gate electrodes 433 and 434 may be formed of single-layer conductive films or two or more layer conductive films.

Figure 13D:
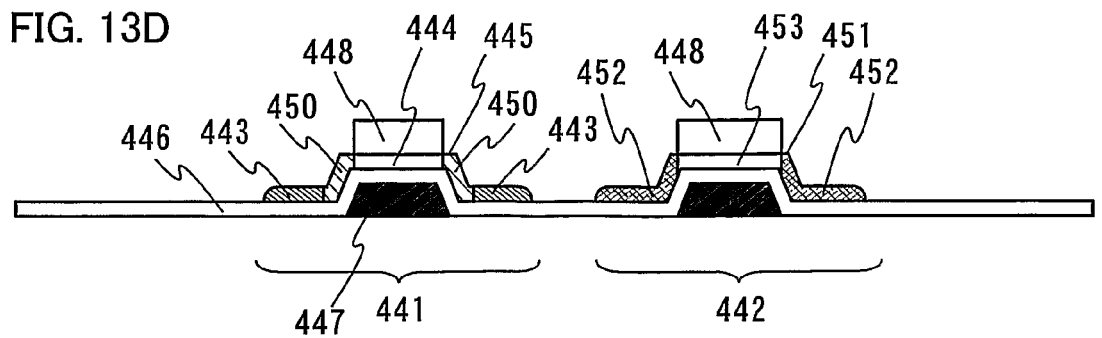

FIG. 13D shows a configuration of bottom-gate TFTs. Reference numeral 441 denotes an n-channel TFT; and 422, a p-channel TFT. The n-channel TFT 441 will be explained in detail as an example.

In FIG. 13D, the n-channel TFT 441 comprises an active layer 445. The active layer 445 includes two impurity regions 443 used as a source region and a drain region, a channel formation region 444 sandwiched between the impurity regions 443, and two LDD (lightly doped drain) regions 450 sandwiched between the two impurity regions 443 and the channel formation region 444. The n-channel TFT 441 further includes a gate insulating film 446, a gate electrode 447 and a protective film 448 made from an insulating film.

The gate electrode 447 overlaps with the channel formation region 444 of the active layer 445 while sandwiching the gate insulating film 446 therebetween. The gate insulating film 446 is formed after forming the gate electrode 447 and the active layer 445 is formed after forming the gate insulating film 446. The protective film 448 overlaps with the gate insulating film 446 while sandwiching the channel formation region 444 therebetween.

The protective film 448, for example, can be formed by etching a silicon oxide film with a thickness of 100 nm. In the embodiment, the silicon oxide film is formed by plasma CVD as the protective film 448. Note that the silicon oxide film may contain nitrogen, however, the number of nitrogen atoms must be set to be lower than that of oxygen atoms.

After doping an n-type impurity to the active layer 445 utilizing a mask made from a resist, the protective film 448 is formed, and an n-type impurity is doped to the active layer 445 while utilizing the protective film 448 as a mask so that the impurity regions 443 and the LDD regions 450 can be formed separately.

Although the p-channel TFT 442 has a almost similar structure to the n-channel TFT 441, the structure of the active layer 451 of the p-channel TFT 442 is only different from that of the n-channel TFT. The active layer 451 does not include an LDD region, and includes two impurity regions 452 and a channel formation region 453 sandwiched between the two impurity regions 452. The impurity regions 452 are doped with a p-type impurity. Although FIG. 13A shows the example in which the p-channel TFT 442 does not have an LDD region, the invention is not limited to the configuration. The p-channel TFT 442 may comprise an LDD region.

This embodiment can be implemented by being freely combined with the configurations in Embodiments 1 to 7.

The invention claimed is:

1. A semiconductor device comprising:
an integrated circuit comprising a transistor;
an antenna configured to receive a signal from a reader/writer wirelessly;
a first sealing film;
a second sealing film;
a protective layer;
a substrate; and
an adhesive,
wherein the integrated circuit and the antenna are electrically connected to each other,
the antenna is covered with the protective layer;
the integrated circuit is sandwiched between the first sealing film and the second sealing film,
the first sealing film is sandwiched between the substrate and the integrated circuit,
the first sealing film is attached to the substrate with the adhesive,
the first sealing film includes a plurality of first insulating films and one or a plurality of second insulating films sandwiched between the plurality of first insulating films,
the second sealing film includes a plurality of third insulating films and one or a plurality of fourth insulating films sandwiched between the plurality of third insulating films,
the one or the plurality of second insulating films has lower stress than the plurality of first insulating films,
the one or the plurality of fourth insulating films has lower stress than the plurality of third insulating films,
the plurality of first insulating films and the plurality of third insulating films are inorganic insulating films,
the adhesive over the substrate, the first sealing film over the adhesive, the integrated circuit over the first sealing film, the antenna over the integrated circuit, and the protective layer over the antenna are covered with the second sealing film, and the second sealing film is partly in contact with the substrate.

2. A semiconductor device comprising:
an integrated circuit comprising a transistor;
an antenna configured to receive a signal from a reader/writer wirelessly;
a first sealing film;
a second sealing film;
a substrate;
a first adhesive;
a second adhesive; and
a cover member, wherein the integrated circuit and the antenna are electrically connected to each other, the integrated circuit is sandwiched between the first sealing film and the second sealing film, the first sealing film and the second sealing film are sandwiched between the substrate and the cover member, the first sealing film is attached to the substrate with the first adhesive, the first sealing film includes a plurality of first insulating films and one or a plurality of second insulating films sandwiched between the plurality of first insulating films, the second sealing film includes a plurality of third insulating films and one or a plurality of fourth insulating films sandwiched between the plurality of third insulating films, the one or the plurality of second insulating films has lower stress than the plurality of first insulating films, the one or the plurality of fourth insulating films has lower stress than the plurality of third insulating films, the plurality of first insulating films and the plurality of third insulating films are inorganic insulating films;

the integrated circuit provided over the substrate is covered with the second adhesive, the second adhesive is in contact with the second sealing film, and the second adhesive is partly in contact with the substrate over which the first adhesive, the first sealing film, and the integrated circuit are provided.

3. A semiconductor device comprising:
an integrated circuit comprising a transistor;
an antenna configured to receive a signal from a reader/writer wirelessly;
a first sealing film;
a second sealing film;
a substrate;
a first adhesive;
a second adhesive; and
a cover member,
wherein the integrated circuit and the antenna are electrically connected to each other,
the integrated circuit and the antenna are sandwiched between the first sealing film and the second sealing film,
the first sealing film and the second sealing film are sandwiched between the substrate and the cover member,
the first sealing film is attached to the substrate with the first adhesive,
the first sealing film includes a plurality of first insulating films and one or a plurality of second insulating films sandwiched between the plurality of first insulating films,
the second sealing film includes a plurality of third insulating films and one or a plurality of fourth insulating films sandwiched between the plurality of third insulating films,
the one or the plurality of second insulating films has lower stress than the plurality of first insulating films,
the one or the plurality of fourth insulating films has lower stress than the plurality of third insulating films,
the plurality of first insulating films and the plurality of third insulating films are inorganic insulating films,
the integrated circuit and the antenna provided over the substrate are covered with the second adhesive,
the second adhesive is in contact with the second sealing film, and
the second adhesive is partly in contact with the substrate over which the first adhesive, the first sealing film, the integrated circuit, and the antenna are provided.

4. The semiconductor device according to claim 2 or 3, wherein the cover member has flexibility.

5. The semiconductor device according to any one of claim 1 through claim 3, wherein the antenna and a gate electrode of the transistor are formed by patterning a conductive film.

6. The semiconductor device according to any one of claim 1 through claim 3, wherein the antenna and a wiring connected to the transistor are formed by patterning a conductive film.

7. A semiconductor device comprising:
an integrated circuit comprising a transistor;
an antenna configured to receive a signal from a reader/writer wirelessly;
a first sealing film;
a second sealing film;
a substrate;
a first adhesive;
a second adhesive; and
a cover member,
wherein the integrated circuit is sandwiched between the first sealing film and the second sealing film,
the first sealing film and the second sealing film are sandwiched between the substrate and the cover member,
the first sealing film is attached to the substrate with the first adhesive,
the cover member is sandwiched between the antenna and the second sealing film,
the integrated circuit and the antenna are electrically connected to each other via a contact hole formed in the cover member and the second sealing film with the second adhesive,
the first sealing film includes a plurality of first insulating films and one or a plurality of second insulating films sandwiched between the plurality of first insulating films,
the second sealing film includes a plurality of third insulating films and one or a plurality of fourth insulating films sandwiched between the plurality of third insulating films,
the one or the plurality of second insulating films has lower stress than the plurality of first insulating films,
the one or the plurality of fourth insulating films has lower stress than the plurality of third insulating films,
the plurality of first insulating films and the plurality of third insulating films are inorganic insulating films,
the integrated circuit provided over the substrate is covered with the second adhesive,
the second adhesive is in contact with the second sealing film, and
the second adhesive is partly in contact with the substrate over which the first adhesive, the first sealing film, and the integrated circuit are provided.

8. The semiconductor device according to claim 7, wherein the cover member has flexibility.

9. A semiconductor device comprising:
an integrated circuit comprising a transistor;
an antenna configured to receive a signal from a reader/writer wirelessly;
a first sealing film;
a second sealing film;
an adhesive; and
a substrate,
wherein the integrated circuit is sandwiched between the first sealing film and the second sealing film, the first sealing film is sandwiched between the substrate and the integrated circuit, the first sealing film is attached to the substrate with the adhesive, the integrated circuit includes a connection terminal, the integrated circuit further includes a rectification circuit for generating a supply voltage from an alternating-current signal that is input in the connection terminal by the antenna; a demodulation circuit for generating a first signal by demodulating the alternating-current signal; a microprocessor for performing arithmetic processing in accordance with the first signal to generate a second signal; a modulation circuit for modulating the second signal; and a switch for modulating load applied to the antenna in accordance with the modulated second signal, the first sealing film includes a plurality of first insulating films and one or a plurality of second insulating films sandwiched between the plurality of first insulating films, the second sealing film includes a plurality of third insulating films and one or a plurality of fourth insulating films sandwiched between the plurality of third insulating films, the one or the plurality of second insulating films has lower stress than the plurality of first insulating films, the one or the plurality of fourth insulating films has lower stress than the plurality of third insulating films, and the plurality of first insulating films and the plurality of third insulating films are inorganic insulating films.

10. The semiconductor device according to any one of claims 1-3, 7 and 9, wherein the substrate has flexibility.

11. The semiconductor device according to any one of claims 1-3, 7 and 9, wherein the plurality of first insulating films or the plurality of third insulating films includes silicon nitride, silicon nitride oxide, aluminum oxide, aluminum nitride, aluminum nitride oxide or aluminum silicon nitride oxide.

12. The semiconductor device according to any one of claims 1-3, 7 and 9, wherein the one or the plurality of second insulating films or the one or the plurality of fourth insulating films includes polyimide, acrylic, polyamide, polyimide amide, benzocyclobutene or epoxy resin.

13. The semiconductor device according to claim 1, wherein the transistor is a thin film transistor.

14. The semiconductor device according to claim 2, wherein the transistor is a thin film transistor.

15. The semiconductor device according to claim 3, wherein the transistor is a thin film transistor.

16. The semiconductor device according to claim 7, wherein the transistor is a thin film transistor.

17. The semiconductor device according to claim 9, wherein the transistor is a thin film transistor.

* * * * *